(12) United States Patent
Yamazaki et al.

(10) Patent No.: US 6,384,427 B1
(45) Date of Patent: May 7, 2002

(54) ELECTRONIC DEVICE

(75) Inventors: Shunpei Yamazaki, Tokyo; Toshimitsu Konuma, Kanagawa; Jun Koyama, Kanagawa; Kazutaka Inukai, Kanagawa; Mayumi Mizukami, Kanagawa, all of (JP)

(73) Assignee: Semiconductor Energy Laboratory Co., Ltd. (JP)

( * ) Notice: Subject to any disclaimer, the term of this patent is extended or adjusted under 35 U.S.C. 154(b) by 0 days.

(21) Appl. No.: 09/697,685

(22) Filed: Oct. 26, 2000

(30) Foreign Application Priority Data

Oct. 29, 1999 (JP) ............................. 11-307866

(51) Int. Cl.[7] ............... H01L 29/04; H01L 31/036; H01L 31/0376; H01L 31/20
(52) U.S. Cl. ............................ 257/59; 257/72
(58) Field of Search ........................ 257/59, 72, 344, 257/347, 350–351

(56) References Cited

U.S. PATENT DOCUMENTS

| 5,643,826 A | 7/1997 | Ohtani et al. ............... 437/88 |
| 5,684,365 A | * 11/1997 | Tang et al. .................. 257/59 |
| 5,923,962 A | 7/1999 | Ohtani et al. ............... 438/150 |
| 6,259,138 B1 | * 7/2001 | Ohtani et al. ............... 257/59 |

FOREIGN PATENT DOCUMENTS

| EP | 717 445 A2 | 6/1996 |
| JP | 07-130652 | 5/1995 |
| JP | 08-078329 | 3/1996 |
| JP | 08-241048 | 9/1996 |
| JP | 08-330602 | 12/1996 |
| JP | 10-270363 | 3/1997 |

OTHER PUBLICATIONS

English abstract re Japanese Patent Application No. 07-130652, published May 19, 1995.
English abstract re Japanese Patent Application No. 08-078329, published Mar. 22, 1996.
English abstract re Japanese Patent Application No. 08-241048, published Sep. 17, 1996.
English abstract re Japanese Patent Application No. 08-330602, published Dec. 13, 1996.
English abstract re Japanese Patent Application No. 10-270363, published Oct. 9, 1998.

* cited by examiner

*Primary Examiner*—Tom Thomas
*Assistant Examiner*—Thien F Tran
(74) *Attorney, Agent, or Firm*—Cook, Alex, McFarron, Manzo, Cummings & Mehler, Ltd.

(57) ABSTRACT

To provide an electronic device capable of bright image display. A pixel is structured such that a switching TFT and a current controlling TFT are formed on a substrate and an EL element is electrically connected to the current controlling TFT. A gate capacitor formed between a gate electrode of the current controlling TFT and an LDD region thereof holds a voltage applied to the gate electrode, and hence a capacitor (condenser) is not particularly necessary in the pixel, thereby making the effective light emission area of the pixel large.

12 Claims, 15 Drawing Sheets

ELECTRONIC DEVICE

BACKGROUND OF THE INVENTION

1. Field of the Invention

The present invention relates to an electronic device having an element that is comprised of a light emitting material sandwiched between electrodes, and to an electric apparatus using the electronic device for its display unit (display or display monitor). Specifically, the present invention relates to an electronic device using a light emitting material that provides EL (Electro Luminescence) (Note that the material will hereinafter be called EL material).

2. Description of the Related Art

In recent years, development is proceeding in an electronic device using a self light emitting element that utilizes the EL phenomenon of a light emitting material (hereinafter referred to as EL element) (the device will hereafter be referred to as EL display device). The EL display device is a display device that uses a self light emitting element and, hence, unlike a liquid crystal display device, does not need a backlight. In addition, the EL display device has a wide angle of view, which makes the device a promising candidate for a display unit of a portable apparatus for outdoor use.

There are two kinds of EL display device: a passive type (passive matrix type) and an active type (active matrix type), and both types are being developed actively. However, what draws attention most is, at present, an active matrix type EL display device. The EL material emitting EL and forming a light-emitting layer also is divided into two types, one being an organic EL material and the other being an inorganic EL material. The organic material is further divided into a low molecular weight type (monomer type) organic EL material and a high molecular weight type (polymer type) organic EL material. The polymer type organic EL material particularly highly regarded, or it is easier to handle and has higher heat resistance in comparison with the low molecular weight type organic EL material. Incidentally, a light-emitting device using an organic EL material is called OLED (organic light emitting diode) in Europe.

The active matrix type EL display device is characterized in that each of pixels that constitute a pixel portion is provided with an electric field transistor, recently, a thin film transistor (hereinafter referred to as TFT), to control the amount of current flowing through an EL element by the TFT. As a typical pixel structure for such an active matrix type EL display device, there is known a structure illustrated in FIG. 1 attached to Japanese Patent Application Laid-open No. Hei 8-241048.

The pixel structure disclosed in the publication sets two transistors (T1, T2) in one pixel, and a capacitor (condenser: Cs) is provided in a drain of the transistor (T1) parallel to the transistor (T2). This capacitor (condenser) is necessary for holding a voltage applied to a gate of the transistor (T2) for one field period or one frame period.

When two transistors and a capacitor (condenser) are formed in one pixel however, these elements occupy almost all the pixel area, causing a reduction of the effective light emission area (the area in which light emitted from a light-emitting layer is allowed to transmit to be used).

SUMMARY OF THE INVENTION

The present invention has been made in view of the above problem, and an object of the present invention is therefore to provide an electronic device capable of bright image display by using a pixel structure with a large effective light emission area. Another object of the present invention is to provide an electronic device of high reliability. Still another object of the present invention is to provide an electric appliance using the electronic device as its display unit.

Yet still another object of the present invention is to provide a process for reducing the cost of manufacturing the electronic device capable of displaying an image with high brightness.

The present invention is characterized in that a voltage applied to a gate of a TFT for supplying current to an EL element (hereinafter referred to as current controlling TFT) is held by a gate capacitor (parasitic capacitor formed between the gate and an active layer) of the current controlling TFT. In other words, the present invention actively utilizes the gate capacitor of the current controlling TFT (corresponding to the transistor (T2) in FIG. 1 of Japanese Patent Application Laid-open No. Hei 8-241048) instead of the capacitor (condenser: Cs) shown in FIG. 1 of Japanese Patent Application Laid-open No. Hei 8-241048.

The present invention is characterized in that an LDD region is formed on a drain region side of the current controlling TFT that is comprised of a P-channel TFT so that the LDD region overlaps with a gate electrode through a gate insulating film sandwiched therebetween. Usually, a P-channel TFT is used without forming therein any LDD region, and thus the invention is characterized by forming the LDD region in order to form the gate capacitor.

The structure as such practically dispenses with the area the capacitor (condenser) occupies, thereby greatly increasing the effective light emission area.

The EL display devices referred to in this specification include triplet-based light emission devices and/or singlet-based light emission devices.

The present invention employs a process of manufacturing a plurality of electronic devices from one large-sized substrate in order to reduce manufacturing cost of the electronic device, namely, to produce a low cost electronic device. The characteristic of the present invention resides in considerably reducing the manufacturing cost by limiting the investment in plant and equipment to a minimum with employment of a process to which an existing production line for liquid crystal can be applied.

DETAILED DESCRIPTION OF THE PREFERRED EMBODIMENT

[Embodiment Mode]

Figure 1:
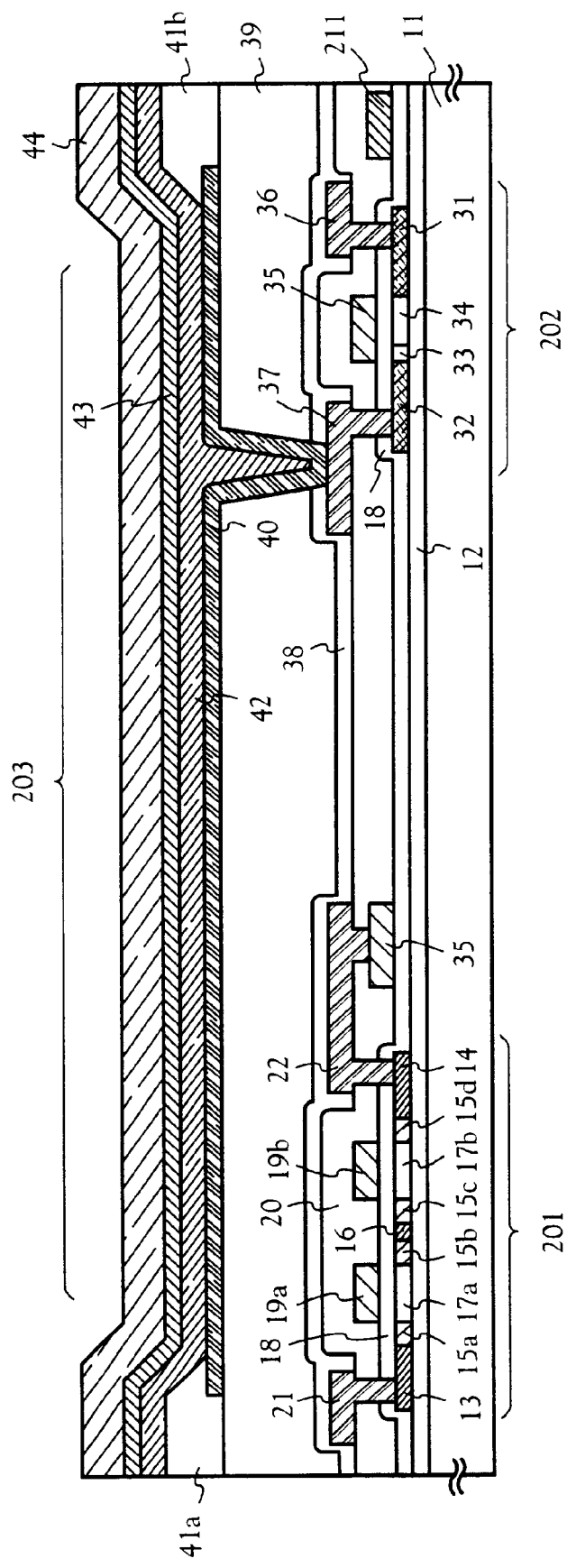
FIG. 1 is a diagram showing the cross sectional structure of the pixel portion of an electronic device of the present invention.
Figure 2A:
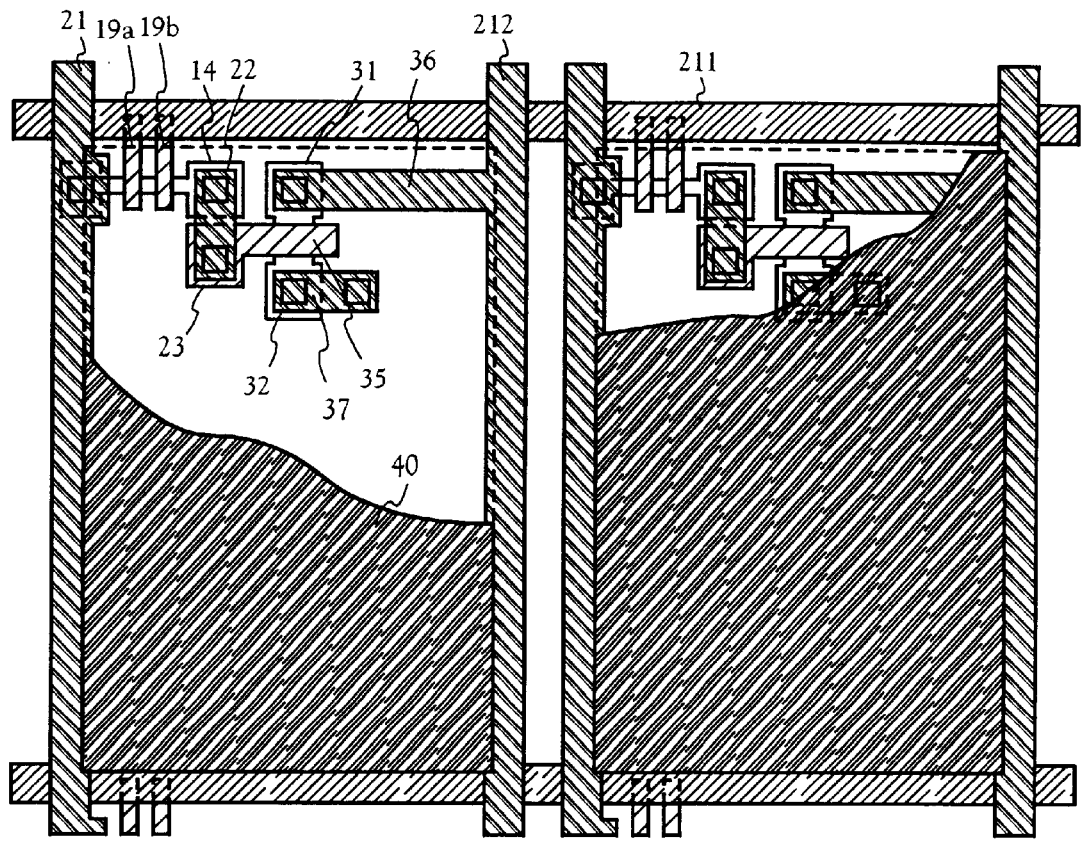
FIGS. 2A and 2B are diagrams showing the top structure and the configuration, respectively, of the pixel portion of the present invention.
Figure 2B:
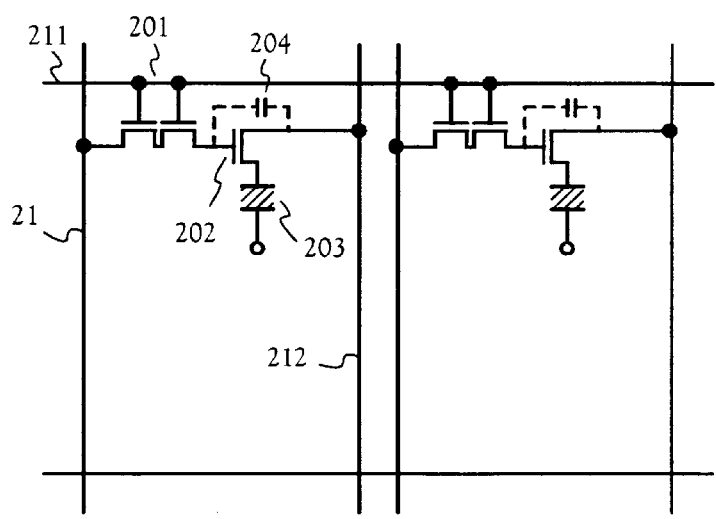

An embodiment mode of the present invention will be described with reference to FIG. 1 and FIGS. 2A and 2B. Shown in FIG. 1 is a sectional view of a pixel portion of an EL display device according to the present invention, and FIG. 2A is a top view thereof whereas FIG. 2B illustrates the circuit structure thereof. Actually, plural pixels are arranged in a matrix-like manner to form the pixel portion (image display portion). Common reference symbols are used in FIG. 1 and FIGS. 2A and 2B. Therefore, the drawings can be cross-referred. Two pixels shown in the top view of FIG. 2A share the same structure.

In FIG. 1, reference symbol 11 denotes a substrate and 12 denotes an insulating film that serves as a base (hereinafter referred to as a base film). Substrates usable as the substrate 11 include a glass substrate, a glass ceramic substrate, a quartz substrate, a silicon substrate, a ceramic substrate, a metal substrate, and a plastic substrate (including a plastic film).

The base film 12 is effective particularly when using a substrate containing a movable ion or a substrate having a conductivity. However, the base film is not necessarily provided on a quartz substrate. An insulating film containing silicon is suitable for the base film 12. The term "an insulating film containing silicon" herein designates, specifically, an insulating film containing, in given proportions, silicon, and oxygen or nitrogen, such as a silicon oxide film, a silicon nitride film, or a silicon oxide nitride film (expressed as SiOxNy).

To give heat releasing action to the base film 12 to release heat generated from the TFT is also effective in preventing degradation of the TFT or degradation of the EL element. Any known material may be used to impart to the base film the heat releasing action.

In FIGS. 2A and 2B, two TFTs are formed in each pixel. Reference symbol 201 denotes a TFT functioning as a switching element (hereinafter referred to as a switching TFT) and 202 denotes a TFT functioning as a current controlling element (hereinafter referred to as current controlling TFT) for controlling the amount of current flowing into the EL element. The switching TFT 201 is composed of an N-channel type TFT whereas the current controlling TFT 202 is composed of a P-channel TFT.

However, according to the present invention, the switching TFT and the current controlling TFT are not necessarily limited to the above combination of N-channel TFT and P-channel TFT. The switching TFT 201 may be formed from a P-channel TFT, or both the switching TFT and the current controlling TFT may be formed from N-channel TFTs.

The switching TFT 201 is formed to have a source region 13, a drain region 14, LDD regions 15a to 15d, an active layer including a high concentration impurity region 16 and channel forming regions 17a, 17b, a gate insulating film 18, gate electrodes 19a, 19b, a first interlayer insulating film 20, a source wiring 21, and a drain wiring 22.

As shown in FIG. 2A, the gate electrodes 19a, 19b constitute the double gate structure in which a gate wiring 211 formed from a material different from a material used for forming the gate electrodes 19a, 19b (the former material is less resistive than the latter material) electrically connects the gate electrode 19a to the gate electrode 19b. The structure of the gate electrodes of course is not limited to the double gate structure, but may be a multi-gate structure (a structure in which a plurality of TFTs are connected in series) such as the triple gate structure.

The multi-gate structure is very effective in lowering an OFF current value, and, in the present invention, the switching TFT 201 of the pixel takes the multi-gate structure to thereby form a switching element having a low OFF current value. The LDD regions 15a to 15d in the switching TFT 201 are formed so as not to overlap with the gate electrodes 19a, 19b through the gate insulating film 18 sandwiched therebetween. This structure is very effective in lowering the OFF current value.

It is even more desirable in terms of lowering the OFF current value to form an offset region (a region which is formed from a semiconductor layer having the same composition as the channel forming regions and to which a gate voltage is not applied) between the channel forming regions and the LDD regions. In the case of a multi-gate structure having two or more gate electrodes, the high concentration region formed between the channel forming regions is effective in lowering the OFF current value.

The OFF current value can be lowered sufficiently when the TFT having the multi-gate structure is used for the switching TFT 201 of the pixel as described above. In other words, that the OFF current value is small means that a voltage applied to the gate of the current controlling TFT can be held longer. This provides an advantage in that the gate voltage of the current controlling TFT can be held until the next writing period even when the capacitor (condenser) for holding the electric potential, as shown in FIG. 1 of Japanese Patent Application Laid-open No. Hei 8-241048, is downsized or omitted.

Next, the current controlling TFT 202 that is a P-channel TFT is formed to have a source region 31, a drain region 32, an active layer including an LDD region 33 and a channel forming region 34, a gate insulating film 18, a gate electrode 35, a first interlayer insulating film 20, a source wiring 36, and a drain wiring 37. The gate electrode 35 has the single gate structure, but may take a multi-gate structure.

As shown in FIG. 1, the drain region 14 of the switching TFT 201 is connected to the gate electrode 35 of the current controlling TFT 202. To be specific, the gate electrode 35 of the current controlling TFT 202 is electrically connected through the drain wiring 22 to the drain region 14 of the switching TFT 201. The source wiring 36 is connected to a current supply line (also called power supply line) 212 (see FIG. 2A).

The current controlling TFT 202 is an element for controlling the amount of current flowing into an EL element 203. Considering degradation of the EL element, it is not desirable to cause a large current to flow through the EL element 203. Therefore, in order to prevent excessive current flow in the current controlling TFT 202, a channel length (L) is preferably designed to be rather long. Desirably, the channel length for one pixel is 0.5 to 2 $\mu$A (more desirably, 1 to 1.5 $\mu$A).

Figure 6:
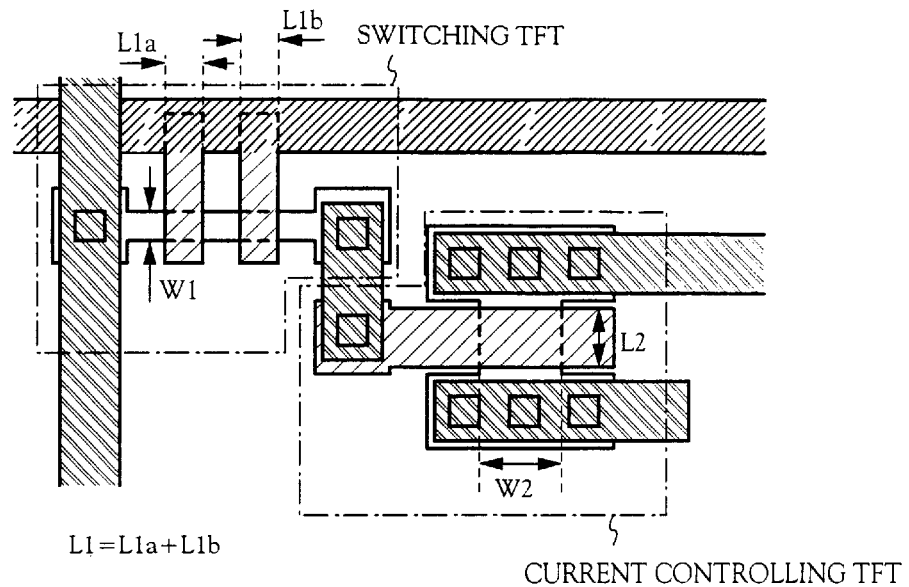
FIG. 6 is an enlarged diagram of the pixel portion of the present invention.

As shown in FIG. 6, the channel length of the switching TFT is given as L1 (L1=L1a+L1b) and the channel width thereof as W1, whereas the channel length of the current controlling TFT is given as L2 and the channel width thereof as W2. Then, based on the above, W1 is preferably 0.1 to 5 $\mu$m (typically 0.5 to 2 $\mu$m), W2 is preferably 0.5 to 10 $\mu$m (typically 2 to 5 $\mu$m). L1 is preferably 0.2 to 18 $\mu$m (typically 2 to 15 $\mu$m), and L2 is preferably 1 to 50 $\mu$m (typically 10 to 30 $\mu$m). However, the present invention is not limited to the values above.

The length (width) of the LDD region formed in the switching TFT 201 is appropriately set to 0.5 to 3.5 $\mu$m, typically 2.0 to 2.5 $\mu$m.

The EL display device shown in FIG. 1 is characterized in that the LDD region 33 is formed between the drain region 32 and the channel forming region 34 in the current controlling TFT 202, and that the LDD region 33 overlaps with the gate electrode 35 through the gate insulating film 18 sandwiched therebetween. The length of the LDD region overlapping with the gate electrode is appropriately set to 0.1 to 3 $\mu$m (preferably 0.3 to 1.5 $\mu$m).

The present invention is characterized by actively using, as a capacitor (condenser) for holding a voltage (for holding electric charges), the parasitic capacitor (gate capacitor) formed between the gate electrode and the active layer that overlaps with the gate electrode through the gate insulating film sandwiched therebetween.

In this embodiment mode, the capacitance of the gate capacitor placed between the gate electrode 35 and the active layer (specifically, the LDD region 33) is increased by forming the LDD region 33 shown in FIG. 1, and this gate capacitor is used as a capacitor (condenser) for holding a voltage applied to the gate of the current controlling TFT 202. Another capacitor may be formed separately, of course, but by adopting the structure of this embodiment mode, the area for forming the capacitor (condenser) can be omitted to thereby increase the effective light emission area of the pixel.

In particular, if the EL display device of the present invention is operated on a digital driving system, a very small capacitor (condenser) is satisfiable as the capacitor (condenser) for holding the voltage. The capacitance thereof is, for example, about one fifth or one tenth compared to the case of an analog driving system. Though it is difficult to present specific values in a wholesale manner because they vary depending upon the ability of the switching TFT and the current controlling TFT, 5 to 30 fF (femto-farad) will be sufficient.

If the switching TFT takes a multi-gate structure to lower the OFF current value as shown in FIG. 1, the capacitance required for the capacitor (condenser) to hold the voltage is further reduced. Therefore no problem is caused by the structure in which only the gate capacitor is used as the capacitor (condenser) for holding the voltage as shown in FIG. 1.

Although the current controlling TFT 202 has the single gate structure in this embodiment mode, it may take a multi-gate structure in which a plurality of TFTs are connected in series. Alternatively, it may be a structure capable of radiating heat with high efficiency, in which a plurality of TFTs are connected parallel to each other to substantially divide the channel forming region into plural sections. This is an effective structure as a countermeasure against degradation by heat.

Reference symbol denotes a first passivation film with film thickness of 10 nm to 1 $\mu$m (preferably 200 to 500 nm). An insulating film containing silicon (a silicon oxide nitride film or a silicon nitride film is particularly preferable) can be used as a material of the first passivation film. It is effective to impart heat releasing action to the first passivation film 38.

A second interlayer insulating film (planarizing film) 39 is formed on the first passivation film 38 to level out a level difference caused by the TFT. A preferred material for the second interlayer insulating film 39 is an organic resin film, and a polyimide film, a polyamide film, an acrylic resin film, a BCB (benzocyclobuten) film, etc., are appropriate. Of course, an inorganic film may be used if it can satisfiably level out the level difference.

It is very important to level out the level difference caused by the TFT using the second interlayer insulating film 39. The EL layer to be formed later is so thin that the existence of a level difference may lead to inferior light emission. Therefore planarization before formation of a pixel electrode is required, so that the EL layer can be formed on a surface as flat as possible.

Denoted by reference symbol 40 is a pixel electrode formed from a transparent conductive film (anode of the EL element). The pixel electrode is formed by opening a contact hole (aperture) piercing through the second interlayer insulating film 39 and the first passivation film 38, and then being brought into contact, in the thus formed aperture, with the drain wiring 37 of the current controlling TFT 202. A conductive film mainly containing a compound of indium oxide and tin oxide or a compound of indium oxide and zinc oxide is preferably used as the pixel electrode 40. The conductive film may of course be layered on another transparent conductive film to form a laminate structure.

Next, an EL material is formed into a light-emitting layer 42. Although both the inorganic EL material and the organic EL material may be used as the EL material for the light-emitting layer, the organic EL material that is low in drive voltage is preferred. As the organic EL material, both the low molecular weight type (monomer type) organic EL material and the high molecular weight type (polymer type) organic EL material may be used.

Representative monomer type organic EL material are Alq$_3$ (8-hydroquinoline aluminum) and DSA (distyryl arylene derivative). Any known material other than these may also be used.

Polyparaphenylene vinylene (PPV), polyvinyl carbazole (PVK), etc., are named as an example of the polymer type organic EL material. Any known material may also be used, of course. Specifically, preferred arrangement is such that cyanopolyphenylene vinylene is used for a light-emitting layer that emits red light, polyphenylene vinylene for a light-emitting layer that emits green light, and polyphenylene vinylene or polyalkylphenylene for a light-emitting layer that emits blue light. An appropriate film thickness thereof is 30 to 150 nm (preferably 40 to 100 nm).

The light-emitting layer may be doped with a fluorescent substance (typically, coumarin 6, rubrene, Nile red, DCM, quinacridone, etc.) to shift the luminescence center to the fluorescent substance and obtain light emission as desired. Any known fluorescent substance may be used.

If the monomer type organic EL material is used as the light-emitting layer 42, the layer is formed by vacuum evaporation. On the other hand, spin coating, printing, the ink jet method, or dispensing is employed to form the light-emitting layer 42 from the polymer type organic EL material. When forming the layer from the polymer type organic EL material, however, the processing atmosphere is desirably a dry inert atmosphere that contains moisture in as small amount as possible. In this embodiment mode, the layer is formed from the polymer type organic EL material by spin coating.

The polymer type organic EL material is formed into the light-emitting layer under normal pressure. However, the organic EL material is easily degraded in the presence of moisture and oxygen. These degradation factors therefore must be removed as much as possible from the processing atmosphere when forming the EL material into the layer. Preferred atmosphere is, for example, dry nitrogen atmosphere, dry argon atmosphere, and the like. Accordingly, it is desirable to place an apparatus for forming the light-emitting layer in a clean booth filled with an inert gas and conduct the step of forming the light-emitting layer in the inert atmosphere.

After thus forming the light-emitting layer 42, then an electron injection layer 43 is formed. A monomer type organic material such as lithium fluoride or acetylacetonate complex is used for the electron injection layer 43. A polymer type organic material or an inorganic material may also be used, of course. An appropriate film thickness thereof is 3 to 20 nm (preferably, 5 to 15 nm).

It should be noted that the materials mentioned above are merely exemplary of organic materials usable as the light-emitting layer or the electron injection layer of the present invention, and that there is no need to limit the layer materials thereto. Also note that, though shown here is a combination of the light-emitting layer and the electron injection layer, the light-emitting layer may be combined with a hole transportation layer, a hole injection layer, an electron transportation layer, a hole blocking layer, or an electron blocking layer.

Provided on the electron injection layer 43 is a cathode 44 formed from a conductive film having a small work function. As the conductive film having a small work function, an aluminum alloy film, a copper alloy film, or a silver alloy film may be used. A laminate film consisting of any of the alloy films mentioned above and another conductive film may be used as well. The cathode 44 also serves as a passivation film for protecting the organic EL material in the light-emitting layer and other layers from oxygen and moisture.

Upon formation of the cathode 44, the EL element 203 is completed. The EL element 203 here is a capacitor (condenser) composed of the pixel electrode (anode) 40, the light-emitting layer 42, the electron injection layer 43, and the cathode 44. In this embodiment mode, the light emitted from the light-emitting layer 42 is transmitted through the substrate 11 to be used, and hence a part of the pixel which is not occupied by the TFT corresponds to the effective light-emission area. According to the present invention, the capacitor (condenser) for holding the gate voltage of the current controlling TFT 202 is taken care of by the current controlling TFT 202 with its own gate capacitor. The effective light emission area is thus wide, making it possible to provide bright image display.

Though shown in this embodiment mode is the structure of a planar type TFT as an example of using a top gate type TFT, a bottom gate type TFT (typically, an inverted stagger type TFT) may also be used.

[Embodiment 1]

The embodiments of the present invention are explained using FIGS. 3A to 5C. A method of simultaneous manufacture of a pixel portion, and TFTs of a driver circuit portion formed in the periphery of the pixel portion, is explained here. Note that in order to simplify the explanation, a CMOS circuit is shown as a basic circuit for the driver circuits.

Figure 3A:
FIGS. 3A to 3E are diagrams showing manufacturing processes of an active matrix substrate of Embodiment 1.

First, as shown in FIG. 3A, a base film 301 is formed with a 300 nm thickness on a glass substrate 300. Silicon nitride oxide films are laminated as the base film 302 in this embodiment. It is good to set the nitrogen concentration at between 10 and 25 wt % in the film contacting the glass substrate 300. Further, it is advantageous to provide the base film with a heat radiation function, a DLC (diamond like carbon) film can also be provided.

Next, an amorphous silicon film (not shown in the figures) is formed with a thickness of 50 nm on the base film 301 by a known deposition method. Note that it is not necessary to limit this to the amorphous silicon film, and another film may be formed provided that it is a semiconductor film containing an amorphous structure (including a microcrystalline semi conductor film). In addition, a compound semiconductor film containing an amorphous structure, such as an amorphous silicon germanium film, may also be used. Further, the film thickness may be made from 20 to 100 nm.

The amorphous silicon film is then crystallized by a known method, forming a crystalline silicon film (also referred to as a polycrystalline silicon film or a polysilicon film) 302. Thermal crystallization using an electric furnace, laser annealing crystallization using a laser, and lamp annealing crystallization using an infrared lamp exist as known crystallization methods. Crystallization is performed in this embodiment using light from an excimer laser which uses XeCl gas.

Note that pulse emission type excimer laser light formed into a linear shape is used in this embodiment, but a rectangular shape may also be used, and continuous emission argon laser light and continuous emission excimer laser light can also be used. Further, the first harmonic laser to the forth harmonic laser of YAG laser can also be used.

Figure 3B:
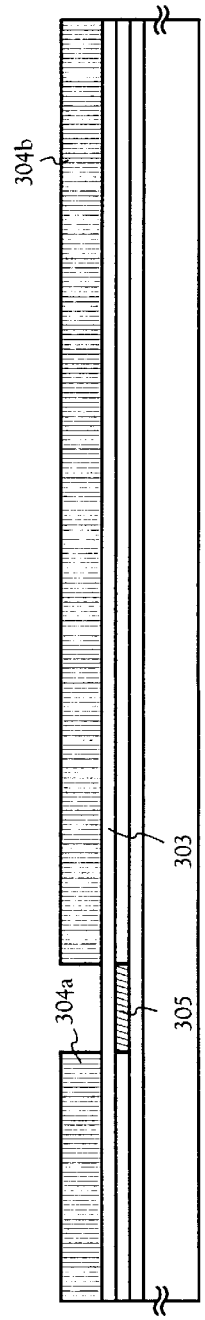
Figure 3C:
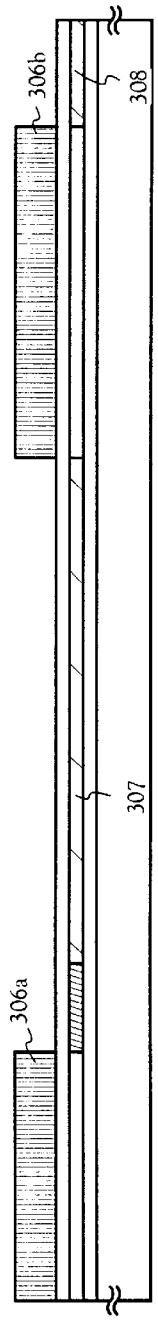

Next, as shown in FIG. 3B, a protecting film 303 is formed on the crystalline silicon film 302 with a silicon oxide film having a thickness of 130 nm. This thickness may be chosen within the range of 100 to 200 nm (preferably between 130 and 170 nm). Furthermore, other films may also be used providing that they are insulating films containing silicon. The protecting film 303 is formed so that the crystalline silicon film is not directly exposed to plasma during addition of an impurity, and so that it is possible to have delicate concentration control of the impurity.

Resist masks 304a and 304b are then formed, and an impurity element which imparts n-type conductivity (hereafter referred to as an n-type impurity element) is added via the protecting film 303. Note that elements residing in periodic table group 15 are generally used as the n-type impurity element, and typically phosphorus or arsenic can be used. Note that a plasma doping method is used, in which phosphine ($PH_3$) is plasma activated without separation of mass, and phosphorus is added at a concentration of $1 \times 1018$ atoms/$cm^3$ in this embodiment. An ion implantation method, in which separation of mass is performed, may also be used, of course.

The dose amount is regulated so that the n-type impurity element is contained in n-type impurity regions 305, thus formed by this process, at a concentration of $2 \times 10^{16}$ to $5 \times 10^{19}$ atoms/$cm^3$ (typically between $5 \times 10^{17}$ and $5 \times 10^{18}$ atoms/$cm^3$).

Next, resist masks 306a and 306b are then formed, and an impurity element which imparts p-type conductivity (hereafter referred to as a p-type impurity element) is added via the protecting film 303. Note that elements residing in periodic table group 13 are generally used as the p-type impurity element, and typically, boron or gallium can be used. Note that a plasma doping method is used, in which diborane ($B_2H_6$) is plasma activated without separation of mass in this embodiment. An ion implantation method, in which separation of mass is performed, may also be used, of course. (See FIG. 3C)

The dose amount is regulated so that the p-type impurity element is contained in p-type impurity regions 307 and 308, thus formed by this process, at a concentration of $1\times10^{15}$ to $5\times10^{17}$ atoms/cm$^3$ (typically between $1\times10^{16}$ and $1\times10^{17}$ atoms/cm$^3$). The p-type impurity element is used to regulate the threshold voltage of n-channel type TFT.

Next, the protecting film 303 is removed, and an activation of the added n-type impurity elements and p-type impurity elements is performed. A known technique of activation may be used as the means of activation, and activation is done in this embodiment by irradiation of excimer laser light. A pulse emission type excimer laser and a continuous emission type excimer laser may both, of course, be used, and it is not necessary to place any limits on the use of excimer laser light. The purpose is the activation of the added impurity element, and it is preferable that irradiation is performed at an energy level at which the crystalline silicon film does not melt. Note that the laser irradiation may also be performed with the protecting film 303 in place.

The activation by heat treatment may also be performed along with activation of the impurity element by laser light. When activation is performed by heat treatment (furnace annealing), considering the heat resistance of the substrate, it is good to perform heat treatment on the order of 450 to 550° C.

Figure 3D:
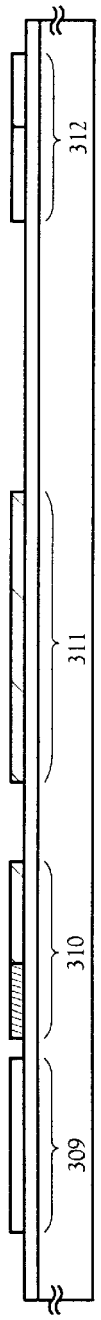

Unnecessary portions of the crystalline silicon film are removed next, as shown in FIG. 3D, and island shape semiconductor films (hereafter referred to as active layers) 309 to 312 are formed.

Figure 3E:
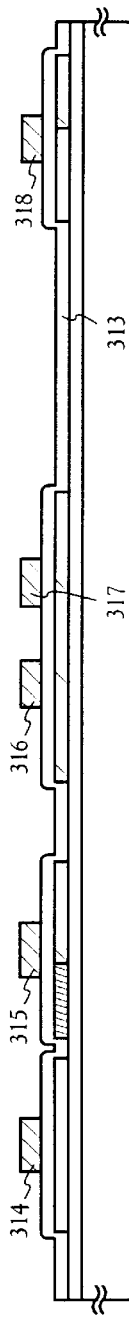

Then, as shown in FIG. 3E, a gate insulating film 313 is formed, covering the active layers 309 to 312. An insulating film containing silicon and with a thickness of 10 to 200 nm, preferably between 50 and 150 nm, may be used as the gate insulating film 313. A single layer structure or a lamination structure may be used. A 110 nm thick silicon nitride oxide film is used in this embodiment.

A conducting film with a thickness of 200 to 400 nm is formed next and patterned, forming gate electrodes 314 to 318. Note that in this embodiment, the gate electrodes and lead wirings electrically connected to the gate electrodes (hereafter referred to as gate wirings) are formed from different materials. Specifically, a material having a lower resistance than that of the gate electrodes is used for the gate wirings. This is because a material which is capable of being micro-processed is used as the gate electrodes, and even if the gate wirings cannot be micro-processed, the material used for the wirings has low resistance. Of course, the gate electrodes and the gate wirings may also be formed from the same material.

Further, the gate wirings may be formed by a single layer conducting film, and when necessary, it is preferable to use a two layer or a three layer lamination film. All known conducting films can be used as the gate electrode material. However, as stated above, it is preferable to use a material which is capable of being micro-processed, specifically, a material which is capable of being patterned to a line width of 2 µm or less.

Typically, it is possible to use a film made of an element selected from tantalum (Ta), titanium (Ti), molybdenum (Mo), tungsten (W), chromium (Cr), and silicon (Si), a film of nitride of the above element (typically a tantalum nitride film, tungsten nitride film, or titanium nitride film), an alloy film of combination of the above elements (typically Mo—W alloy, Mo—Ta alloy), or a silicide film of the above element (typically a tungsten silicide film, titanium silicide film). Of course, the films may be used as a single layer or a laminate layer.

In this embodiment, a laminate film of a tungsten nitride (WN) film having a thickness of 30 nm and a tungsten (W) film having a thickness of 370 nm is used. These may be formed by a sputtering method. When an inert gas of Xe, Ne or the like is added as a sputtering gas, film peeling due to stress can be prevented.

The gate electrodes 315 and 318 are formed at this time so as to overlap and sandwich a portion of the n-type impurity regions 305, a part of p-type impurity region 308, and the gate insulating film 313 respectively. This overlapping portion later becomes an LDD region overlapping the gate electrode.

Figure 4A:
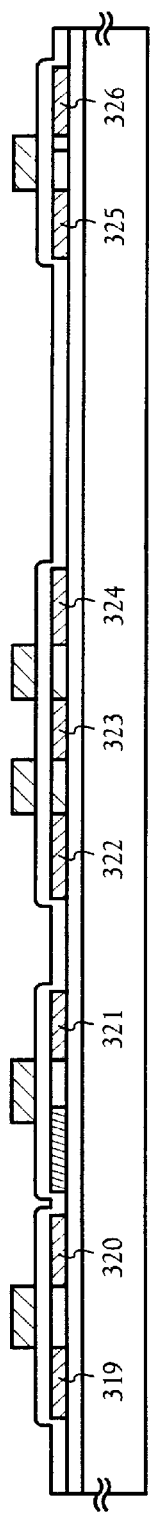
FIGS. 4A to 4D are diagrams showing manufacturing processes of the active matrix substrate of Embodiment 1.

Next, an n-type impurity element (phosphorus is used in this embodiment) is added in a self-aligning manner with the gate electrodes 314 to 318 as masks, as shown in FIG. 4A. The addition is regulated so that phosphorus is added to impurity regions 319 to 326 thus formed at a concentration of 1/10 to 1/2 that of the n-type impurity regions 305 (typically between 1/4 and 1/3). Specifically, a concentration of $1\times10^{16}$ to $5\times10^{18}$ atoms/cm$^3$ (typically $3\times10^{17}$ to $3\times10^{18}$ atoms/cm$^3$) is preferable.

Figure 4B:
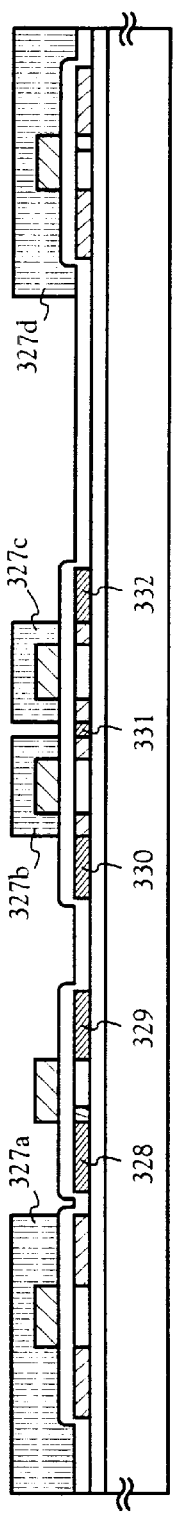

Resist masks 327*a* to 327*d* are formed next, with a shape covering the gate electrodes etc, as shown in FIG. 4B, and an n-type impurity element (phosphorus is used in this embodiment) is added, forming impurity regions 328 to 332 containing a high concentration of phosphorus. Ion doping using phosphine ($PH_3$) is also performed here, and is regulated so that the phosphorus concentration of these regions is from $1\times10^{20}$ to $1\times10^{21}$ atoms/cm$^3$ (typically between $2\times10^{20}$ and $5\times10^{20}$ atoms/cm$^3$).

A source region or a drain region of the n-channel TFT is formed by this process, and in the switching TFT, a portion of the n-type impurity regions 322 to 324 formed by the process of FIG. 4A remains. These remaining regions correspond to the LDD regions 15*a* to 15*d* of the switching TFT in FIG. 1.

Figure 4C:
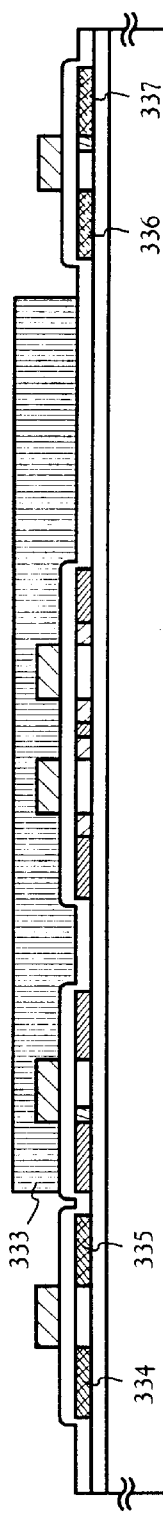
Figure 4D:
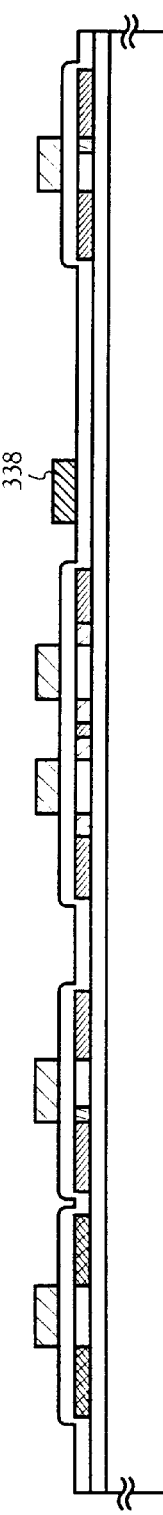

Next, as shown n FIG. 4C, the resist masks 327*a* to 327*d* are removed, and a new resist mask 333 is formed. A p-type impurity element (boron is used in this embodiment) is then added, forming impurity regions 334 to 337 containing a high concentration of boron. Boron is added here at a concentration of $3\times10^{20}$ to $3\times10^{21}$ atoms/cm$^3$ (typically between $5\times10^{20}$ and $1\times10^{21}$ atoms/cm$^3$) by ion doping using diborane ($B_2H_6$).

Note that phosphorus has already been added to the impurity regions 334 to 337 at a concentration of $1\times10^{16}$ to $5\times10^{18}$ atoms/cm$^3$, but boron is added here at a concentration of at least 3 times than of the phosphorus. Therefore, the n-type impurity regions already formed completely invert to p-type, and function as p-type impurity regions.

Next, after removing the resist mask 333, the n-type and p-type impurity elements added at various concentrations are activated. Furnace annealing, laser annealing, or lamp annealing may be performed as a means of activation. Heat treatment is performed in this embodiment in a nitrogen atmosphere for 4 hours at 550° C. in an electric furnace.

It is important to remove as much of the oxygen in the atmosphere as possible at this time. This is because if any oxygen exists, then the exposed surface of the electrode is oxidized, inviting an increase in resistance, and at the same time it becomes more difficult to later make an ohmic contact. It is therefore preferable that the concentration of oxygen in the processing environment in the above activation process should be 1 ppm or less, desirably 0.1 ppm or less.

After the activation process is completed, a gate wiring 338 with a thickness of 300 nm is formed next. A metallic film having aluminum (Al) or copper (Cu) as its principal constituent (comprising 50 to 100% of the composition) may be used as the material of the gate wiring 338. As with the gate wiring 211 of FIGS. 2A and 2B, the gate wiring 338 is formed with a placement so that the gate electrodes 316 and 317 of the switching TFTs (corresponding to gate electrodes 19a and 19b of FIG. 1) are electrically connected. (See FIG. 4D.)

The wiring resistance of the gate wiring can be made extremely small by using this type of structure, and therefore a pixel display region (pixel portion) having a large surface area can be formed. Namely, the pixel structure of this embodiment is extremely effective because an EL display device having a screen size of a 10 inch diagonal or larger (in addition, a 30 inch or larger diagonal) is realized due to this structure.

Figure 5A:
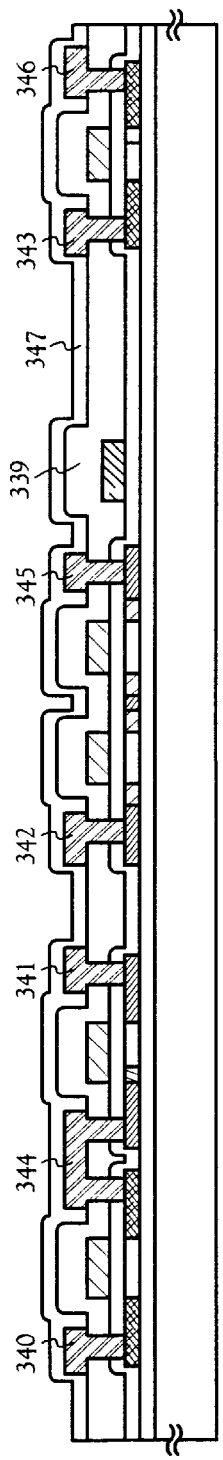
FIGS. 5A to 5C are diagrams showing manufacturing processes of the active matrix type substrate of Embodiment 1.

A first interlayer insulating film 339 is formed next, as shown in FIG. 5A. A single layer insulating film containing silicon is used as the first interlayer insulating film 339, while a lamination film may be combined in between. Further, a film thickness of between 400 nm and 1.5 $\mu$m may be used. A lamination structure of an 800 nm thick silicon oxide film on a 200 nm thick silicon nitride oxide film is used in this embodiment.

In addition, heat treatment is performed for 1 to 12 hours at 300 to 450° C. in an environment containing between 3 and 100% hydrogen, performing hydrogenation. This process is one of hydrogen termination of dangling bonds in the semiconductor film by hydrogen which is thermally activated. Plasma hydrogenation (using hydrogen activated by a plasma) may also be performed as another means of hydrogenation.

Note that the hydrogenation step may also be inserted during the formation of the first interlayer insulating film 339. Namely, hydrogen processing may be performed as above after forming the 200 nm thick silicon nitride oxide film, and then the remaining 800 nm thick silicon oxide film may be formed.

Next, a contact hole is formed in the first interlayer insulating film 339, and source wiring lines 340 to 343 and drain wiring lines 344 to 346 are formed. In this embodiment, this electrode is made of a laminate film of three-layer structure in which a titanium film having a thickness of 100 nm, an aluminum film containing titanium and having a thickness of 300 nm, and a titanium film having a thickness of 150 nm are continuously formed by a sputtering method. Of course, other conductive films may be used.

A first passivation film 347 is formed next with a thickness of 50 to 500 nm (typically between 200 and 300 nm). A 300 nm thick silicon nitride oxide film is used as the first passivation film 347 in this embodiment. This may also be substituted by a silicon nitride film. Note that it is effective to perform plasma processing using a gas containing hydrogen such as $H_2$ or $NH_3$ etc. before the formation of the silicon nitride oxide film. Hydrogen activated by this preprocess is supplied to the first interlayer insulating film 339, and the film quality of the first passivation film 347 is improved by performing heat treatment. At the same time, the hydrogen added to the first interlayer insulating film 339 diffuses to the lower side, and the active layers can be hydrogenated effectively.

Figure 5B:
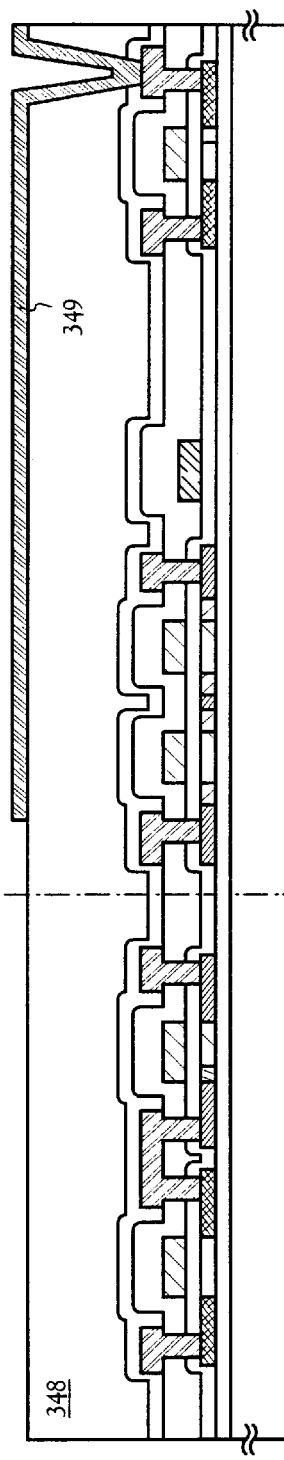

Next, as shown in FIG. 5B, a second interlayer insulating film 348 made of organic resin is formed. As the organic resin, it is possible to use polyimide, polyamide, acryl, BCB (benzocyclobutene) or the like. Especially, since the second interlayer insulating film 348 is primarily used for flattening, acryl excellent in flattening properties is preferable. In this embodiment, an acrylic film is formed to a thickness sufficient to flatten a stepped portion formed by TFTs. It is appropriate that the thickness is preferably made 1 to 5 $\mu$m (more preferably, 2 to 4 $\mu$m).

A contact hole reaching a drain wiring line 346 is formed through the second interlayer insulating film 348, and the first passivation film 347, and a pixel electrode 349, which is made of transparent conductive film, is formed. In this embodiment, a conductive film having a thickness of 120 nm is formed, which is made of combined element of indium-tin oxide and zinc oxide, as a pixel electrode 349.

Figure 5C:
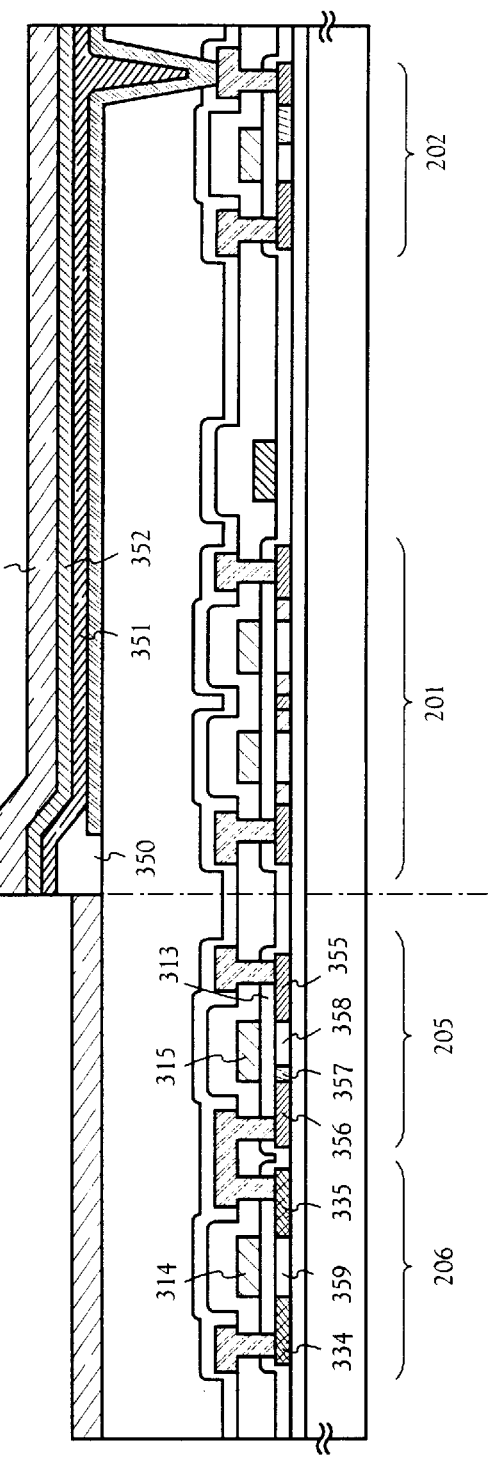

Next, an insulating film 350 is formed as shown in FIG. 5C. The insulating film 350 is formed by patterning the organic resin film or the insulating film contains 100–300 nm silicon. This insulating film 350 is formed to fill the space between pixels (pixel electrodes). This insulating film 350 is formed for organic EL material, which is formed next, of luminescence layer not to overlap the edge portion of pixel electrode 349.

A light emitting layer 351 is next formed by the spin coating method. Specifically, an organic EL material that becomes the light emitting layer 351 is dissolved in a solvent such as chloroform, dichloromethane, xylene, toluene, and tetrahydrofuran, and is then applied. Thereafter, heat treatment is performed to volatilize the solvent. A film (light emitting layer) made of the organic EL material is thus formed. In this embodiment, a paraphenylene vinylene is used for the light emitting layer emitting green color. The light emitting layer is formed to a thickness of 50 nm. In addition, 1.2 dichloromethane is used as a solvent, and then volatilized by performing heat treatment on a hot plate at 80 to 150° C. for 1 minute.

Next, an electron injection layer 352 is formed to a thickness of 20 nm. As an electron injection layer 352, lithium fluoride is formed by the evaporation. As an electron injection layer 352, other polymer organic material and monomer organic material can be used. The inorganic material can also be used.

A two-layered structure made of the light emitting layer and the electron injection layer is formed in Embodiment 1. However, other layers such as a hole transporting layer, a hole injection layer, and an electron transporting layer may also be provided. Examples of various lamination structures of such combination of layers have been reported, and any structure may be used for the present invention.

After the formation of the light emitting layer 351 and the electron injection layer 352, an cathode 353 made of a small work function transparent conductive film is formed to a thickness of 350 nm. In this embodiment, an alloy of lithium and aluminum is formed by vacuum evaporation method.

An active matrix substrate having a structure as shown in FIG. 5C is thus completed. Note that after the formation of the insulating film 350, it is effective to use the multichamber method (or the in-line method) of the thin film deposition apparatus for the process of forming the films until the formation of the cathode 353, in succession and without exposure to the atmosphere.

In the active matrix substrate of this embodiment, TFTs having optimal structures are arranged not only in the pixel portion but also in the driver circuit portion, thereby indicating an extremely high reliability and increasing its operation performance.

First, a TFT having a structure to decrease hot carrier injection so as not to drop the operation speed thereof as much as possible is used as an n-channel TFT 205 of a CMOS circuit forming a driver circuit portion. Note that the driver circuit here includes a shift register, a buffer, a level shifter, a sampling circuit (sample and hold circuit), a D/A converter and the like.

In the case of this embodiment, as shown in FIG. 5C, an active layer of the n-channel TFT 205 is composed of a source region 355, a drain region 356, an LDD region 357, and a channel forming region 358. The LDD region 357 overlaps the gate electrode 315 via the gate insulating film 313.

Consideration not to drop the operation speed is the reason why the LDD region is formed at only the drain region side. In this n-channel TFT 205, it is not necessary to pay attention to an OFF current value very much, rather, it is better to give importance to an operation speed. Thus, it is desirable that the LDD region 357 is made to completely overlap the gate electrode to decrease a resistance component to a minimum.

The p-channel TFT 206 in the CMOS circuit includes the source region 334, the drain region 335 and the channel formation region 359. Furthermore, deterioration due to the injection of hot carriers is almost negligible, and thus, it is not necessary to provide any LDD region however it is also possible to provide it.

Note that, in practice, it is preferable to additionally perform packaging (sealing) after completing up through FIG. 5C by using a highly airtight protective film which has very little gas leakage (such as a laminate film or an ultraviolet cured resin film) or a sealing material that is transmissive, so that there is no exposure to the atmosphere. By making the surrounded portion by the sealing material an inert environment, an inert liquid material and an inert solid material and by placing a drying agent (for example, barium oxide) within the sealing material, the reliability of the EL element is increased.

Furthermore, aft the airtightness is increased by the packing processing etc., a connector (a flexible printed circuit, FPC) for connecting output terminals from elements or circuits formed on the substrate and external signal terminals, is attached, completing an electronic device using EL element. The electronic device of this specification includes a connector for input a signal from outside and integral circuit which is connected to the connector.

Figure 7:
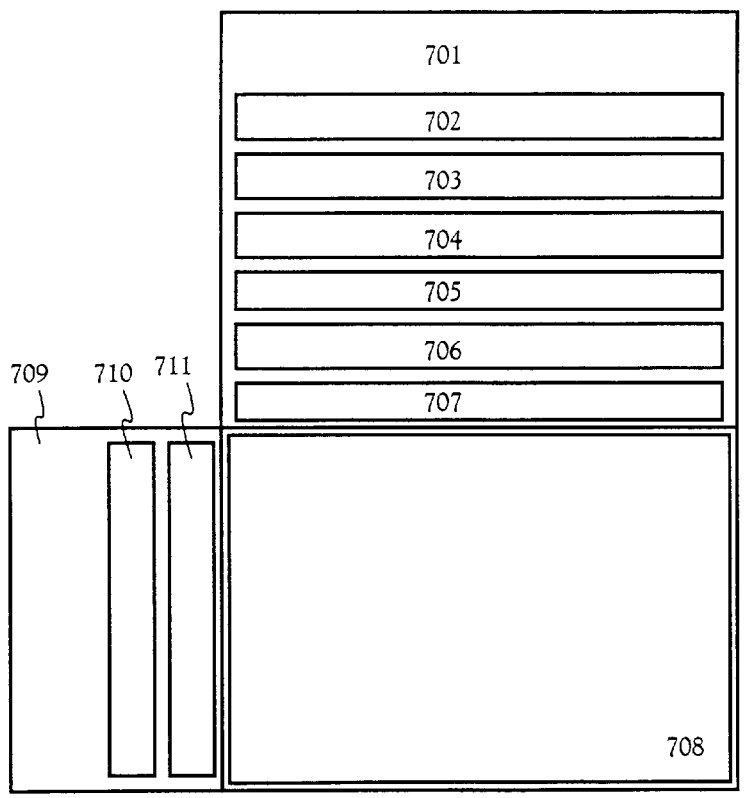
FIG. 7 is a diagram showing the circuit block structure of an EL display device of Embodiment 1.

Here, the structure of the EL display device of this embodiment will be described with reference in FIG. 7. The EL display device of this embodiment is constituted by a source side driver circuit 701, a pixel portion 708, and a gate side driver circuit 709. Further, in this embodiment, the driver circuit portion is a general term including the source side driver circuit and the gate side driver circuit.

In this embodiment, an n-channel TFT having multi-gate structure is provided as a switching TFT in the pixel portion 708, the switching TFT is arranged to the intersection of gate wiring and source wiring which are connected to the gate side driver circuit 709 and the source side driver circuit 701 respectively. Further, the drain region of the switching TFT is connected to the gate electrode of p-channel type current control TFT electrically.

The source side driver circuit 701 is provided with a shift register 702, a buffer 703, a latch (A) 704, a buffer 705, a latch (B) 706 and a buffer 707. Further, in the case of analog driver, the sampling circuit is provided instead of a latch (A) and a latch (B). The gate side driver circuit 709 is provided with a shift register 710, and a buffer 711.

Further, not shown in the figure, the gate side driver circuit can be provided at the opposite side of the gate driver circuit 709 via the pixel portion 708. In this case, the both side own jointly gate wirings in the same structure. The structure is if the one is destroyed, the other one send a gate signal to operate a pixel portion correctly.

The foregoing structure can be easily realized by manufacturing TFTs in accordance with the manufacturing processes shown in FIGS. 3A to 5C. In this embodiment, although only the structure of the pixel portion and the driver circuit portion is shown, if the manufacturing processes of this embodiment are used, it is possible to form a logical circuit, such as a signal dividing circuit, a D/A converter circuit, an operational amplifier circuit, a γ-correction circuit, on the same substrate, and further, it is considered that a memory portion, a microprocessor, or the like can be formed.

Figure 8A:
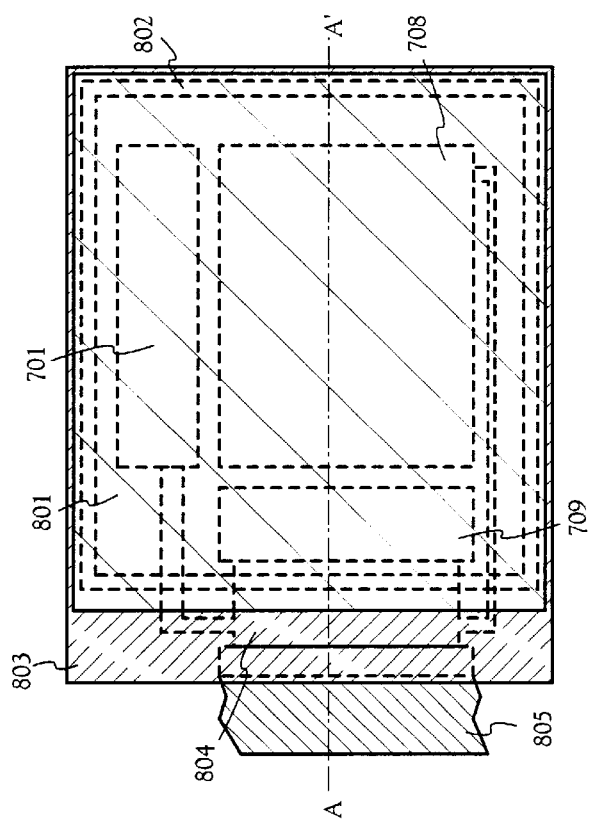
FIGS. 8A and 8B are cross sectional diagrams of an EL display device of Embodiment 1.
Figure 8B:
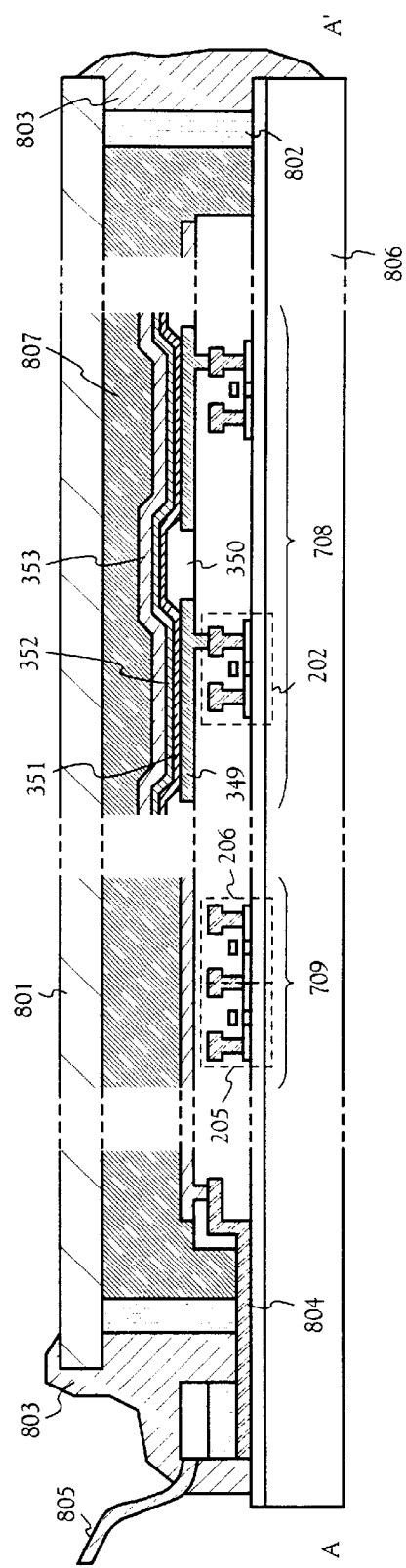

Furthermore, an explanation of the EL display device of this embodiment, containing the sealing material to protect an EL element, is made using FIGS. 8A and 8B. Note that, when necessary, the reference symbols used in FIG. 7 is cited.

FIG. 8A is a diagram showing the top view of a state of complete sealing process to protect an EL element. Indicated by dotted lines, reference numeral 708 denotes a pixel portion, 709 denotes a gate side driver circuit, and 701 denotes a source side driver circuit. Reference numeral 801 denotes a cover material, 802 denotes a first seal member, 803 denotes a second seal member and a filling material (not shown in the figure) is provided between an active matrix substrate and a portion cover material 801 which is enclosed by the first seal member 802.

Further, reference numeral 804 denotes a connection wiring to transmit the signal which is input to the source side driver circuit 701 and the gate side driver circuit 709. The connection wiring accepts a video signal and clock signal from an outside input terminal FPC 805.

Here, the cross-sectional view taken along line A–A' of FIG. 8A is shown in FIG. 8B. It is to be noted that the same reference numerals are used for the same components in FIGS. 8A and 8B.

As shown in FIG. 8B, the pixel portion 708 and the gate side driver circuit 709 are formed on the glass substrate 806. The pixel portion 708 is formed of a plurality of pixels containing the current control TFT 202 and the pixel electrode 349 which is electrically connected to the drain region of the current control TFT 202. Further, the gate side driver circuit 709 is formed by using a CMOS circuit that is a complementary combination of the n-channel TFT 205 and the p-channel TFT 206.

The pixel electrode 349 functions as the anode of the EL element. In addition, the insulating film 350 is formed on both ends of the pixel electrode 349, and the light emitting layer 351 and the electron injection layer 352 are formed. The cathode 353 of the EL element is further formed on the top.

In the case of this embodiment, the cathode 353 also functions as a common wiring to all the pixels, and is electrically connected to the FPC 805 through the connection wiring 804. Furthermore, all the elements contained in the pixel portion 708 and the gate side driver circuit 709 are covered by the cathode 353. The cathode 353 has a function as a connection wiring but also a passivation film to protect an EL element from water and oxygen, and as a electric field shielding film.

Next, after forming a first seal member 802 by a dispenser, scattering a spacer (not shown in figure) to attach a cover material 801. The spacer is scattered to maintain the distance between an active matrix substrate and cover material 801. And, the filling material 807 is filled inside of the first seal member 802 by a vacuum injecting method. The technique, which is used in a cell assembling process of liquid crystal display, can be used to foregoing process. It is preferable to use a photo curing resin as the first seal member 802, but a thermally curable resin may also be used provided that the thermal resistance of the EL layer permits. Note that it is preferable that the first seal member 802 be a material through which as little moisture and oxygen as possible are transmitted. Further, a drying agent may also be added to the inside of the first seal member 802.

Next, a filling material 807 is provided so as to cover the EL element. The filling material 807 also functions as an adhesive for attaching the cover material 801. As the filling material 807, polyimide, acryl, PVC (polyvinyl chloride), epoxy resins, silicone resins, PVB (polyvinyl butyral) or EVA (ethylene vinyl acetate) can be used.

It is preferable to place a drying agent (not shown in the figure) inside the filling material 807 because the absorbent effect can be maintained. At this point, the drying agent may be an agent doped into the filling material, or an agent enclosed in the filling material. Further, as above-mentioned spacer (not shown in the figure), it is effective to use an absorbent material.

Further, in this embodiment, a glass plate, a quartz plate, a plastic plate, a ceramic plate, an FRP (Fiberglass-Reinforced Plastics) plate, PVF (polyvinyl fluoride) film, a Mylar film, a polyester film, or an acrylic film can be used as the cover material 801.

After using the filling material 807 to attach the cover material 801, the second seal member 803 is next formed so as to cover a side surface (the exposed surface) of the first seal member 802. The second seal member 803 can use the same material as the first seal member 802.

The EL element is thus sealed into the filling material 807 by using the above procedure, to thereby completely cut off the EL element from the external atmosphere and to prevent the penetration of substances such as moisture and oxygen from the outside which stimulate the deterioration of the EL element due to the oxidation of the EL layer. Accordingly, highly reliable EL display devices can be manufactured.

[Embodiment 2]

In this embodiment, an example of a case in which a pixel constitution shown in FIG. 9 differs from that of the circuit diagram (constitution) shown in FIG. 2B. Note that in this embodiment, reference numeral 901 denotes source wiring of a switching TFT 902, 903 denotes a gate wiring of a switching TFT 902, 904 denotes a current control TFT, 905 denotes a capacitor, 906 and 908 denote electric current supply lines, and 907 denotes an EL element.

It is to be noted that the capacitor 905 employs a gate capacitance of the current control TFT 904. Substantially, the capacitor 905 is not provided, and therefore it is indicated by a dotted line.

Figure 9A:
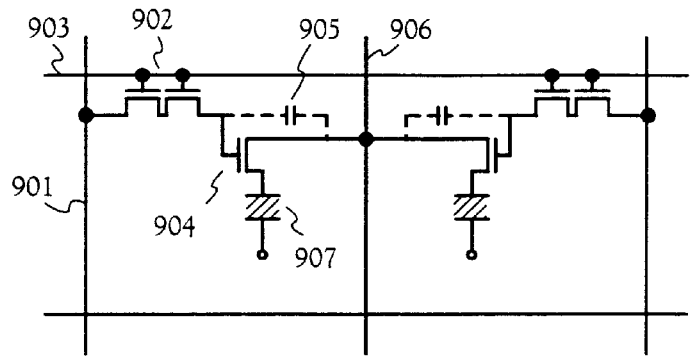
FIGS. 9A to 9C are diagrams showing the circuit structures of an EL display device of Embodiment 2.

FIG. 9A is an example of a case in which the electric current supply line 906 is common between two pixels. Namely, this is characterized in that the two pixels are formed having linear symmetry around the electric current supply line 906. In this case, the number of the electric current supply line can be reduced, and therefore the pixel portion can be made with higher definition.

Figure 9B:
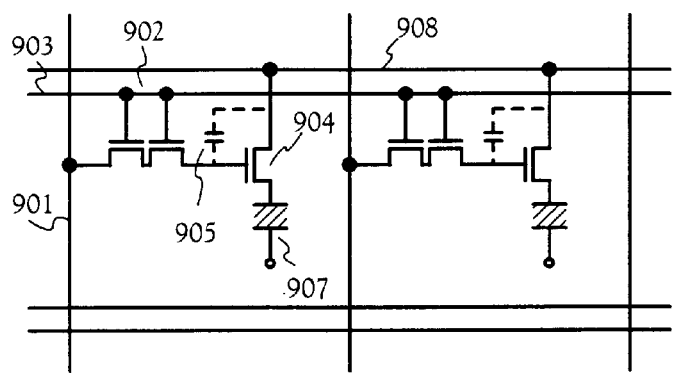

Further, FIG. 9B is an example of a case in which the electric current supply line 908 is formed parallel to the gate wiring 903. In FIG. 9B, the structure is formed such that the electric current supply line 908 and the gate wiring 903 not to overlap. However, forming both in different layers, the films can be located overlapping each other with an insulating film therebetween. In this case, the exclusive surface area can be shared by the electric current supply line 908 and the gate wiring 903, and the pixel portion can be made with higher definition.

Figure 9C:
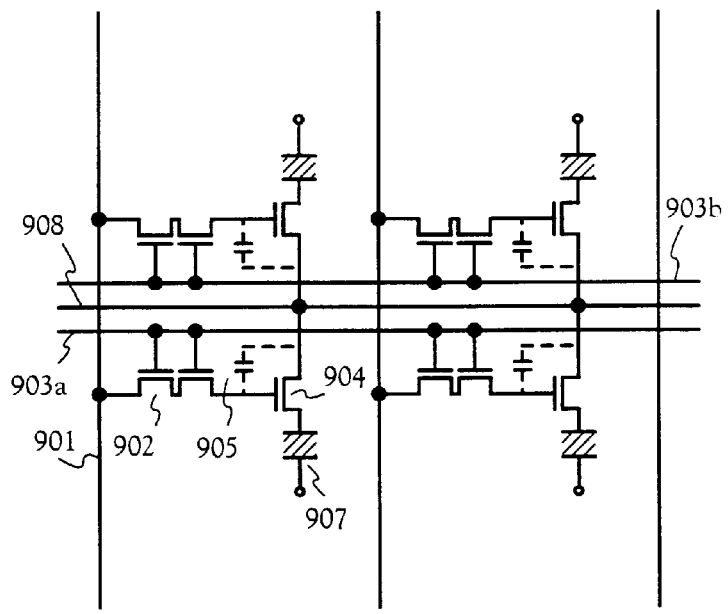

Furthermore, FIG. 9C is characterized in that the electric current supply line 908 and the gate wiring 903a, 903b are formed in parallel, similar to the structure of FIG. 9B, and additionally, in that the two pixels are formed so as to have linear symmetry around the electric current supply line 908. In addition, it is effective to form the electric current supply line 908 so as to overlap with one of the gate wirings 903a, 903b. In this case, the number of electric current supply lines can be reduced, and therefore the pixel portion can be made with higher definition.

In addition, it is effective to employ the EL display device having the pixel structure of this embodiment as the display portion of the electronic equipment of Embodiment 1.

[Embodiment 3]

In this embodiment, examples in which the element structure of the electric current controlling TFT 202 shown in FIG. 1 is made a different one, will be described with reference to FIGS. 10A to 10D. Specifically, examples in which the arrangement of the LDD region is made a different one, will be described. Incidentally, the same portions as those of the electric current controlling TFT 202 shown in FIG. 1 are designated by the same symbols.

Figure 10A:
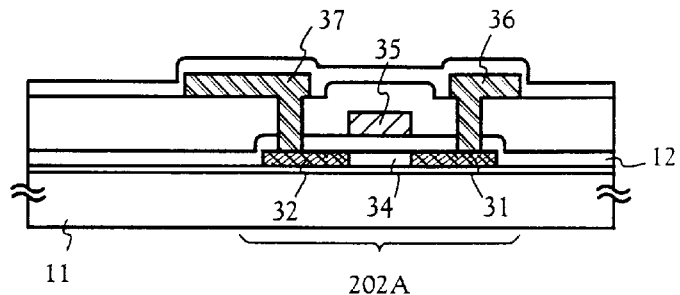
FIGS. 10A and 10D are cross sectional diagrams of the current control TFTs of Embodiment 3.

An electric current controlling TFT 202A shown in FIG. 10A is an example in which the LDD region 33 is omitted from the electric current controlling TFT 202 shown in FIG. 1. In the case shown in FIG. 1, since the switching TFT 201 has a triple-gate structure, an off current value is very small, and if a digital driving system is used, the capacitance of a capacitor for holding the electric potential of the gate of the electric current controlling TFT 202A may be very small.

Thus, as shown in FIG. 10A of this embodiment, it is possible to hold the electric potential of the gate of the electric current controlling TFT 202A only by a gate capacitance formed between a gate electrode 35 and a drain region 32.

Figure 10B:
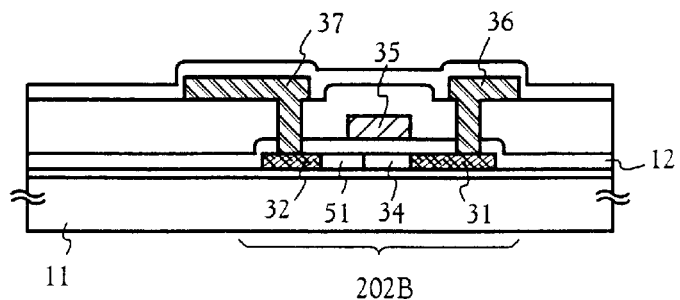

Next, an electric current controlling TFT 202B shown in FIG. 10B is an example in which a gate electrode 35 overlaps with a part of an LDD region 51 through a gate insulating film. In this case, a portion of the LDD region 51 not overlapping with the gate electrode 35 functions as a resistor so that it has an effect of decreasing the off current value. That is, by making the structure of FIG. 10B, it is possible to realize lowering of the off electric current value.

Figure 10C:
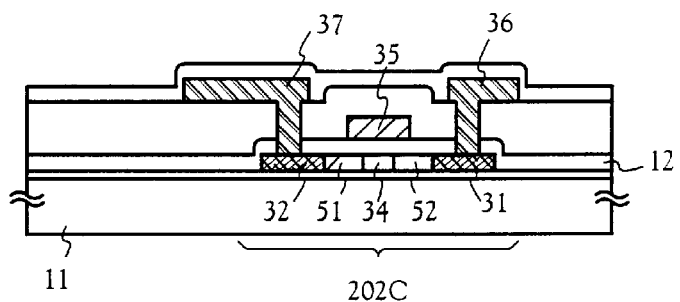

Next, an electric current controlling TFT 202C shown in FIG. 10C is an example in which the LDD region 51 shown in FIG. 10B is provided at not only the side of the source region 31 but also at the side of the drain region 32. In this embodiment, an additional region is made an LDD region 52. Such a structure is an effective structure in the case where the direction of flow of electrons is changed (source region and drain region are inverted) like a sampling circuit used in an analog driving system.

Thus, it is also possible to use the structure of FIG. 10C for a switching TFT. Also in that case, it is possible to realize both the suppression of deterioration due to the hot carrier injection and the lowering of the off current value at the same time.

Figure 10D:
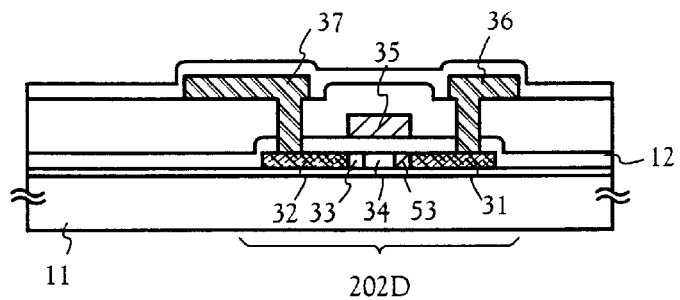

Next, an electric current controlling TFT 202D shown in FIG. 10D is an example in which the LDD region 33 shown in FIG. 1 is provided at both the side of the source region 31 and the side of the drain region 32. In this embodiment, an additional region is made an LDD region 53. Such a structure is an effective structure in the case where the direction of flow of electrons is changed like a sampling circuit used in an analog driving system.

Incidentally, any of the structures of this embodiment can be substituted for the electric current controlling TFT 202 of the embodiment 1, and can also be combined with the embodiment 2.

[Embodiment 4]

In this embodiment, a description will be made on a case where a plurality of EL display devices of the present invention are fabricated by using a large substrate (large wafer). Top views of FIGS. 11A to 13B are used for the description. Incidentally, sectional views taken along line A–A' and B–B' are also shown in the respective top views.

Figure 11A:
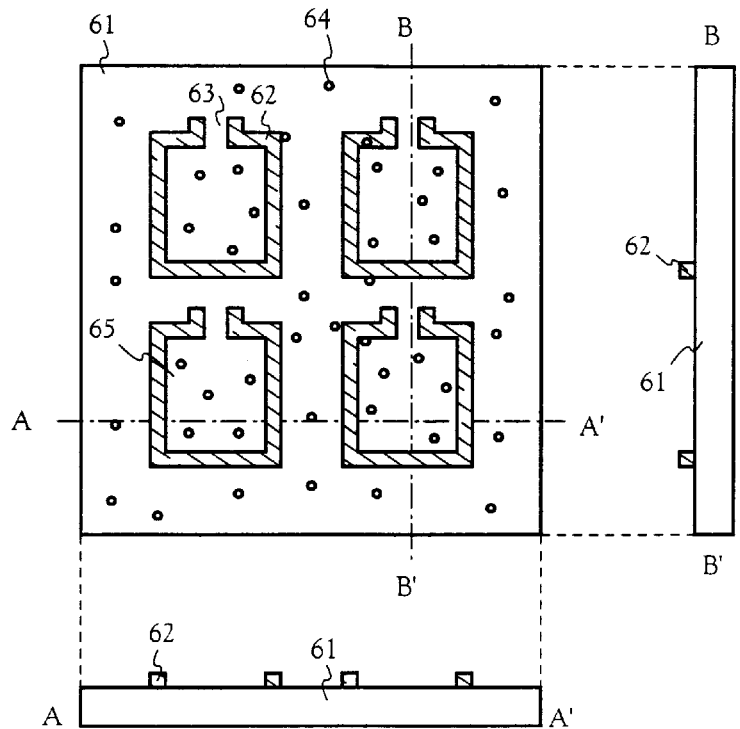
FIGS. 11A and 11B are diagrams showing processes of obtaining multiple number of an EL display device of Embodiment 4.

FIG. 11A is a view showing a state where a seal member is formed on an active matrix substrate fabricated in the embodiment 1. Reference numeral 61 designates the active matrix substrate, and first seal members 62 are provided at plural places. The first seal member 62 is formed while an opening portion 63 is secured.

A filler (rod-like spacer) may be added in the first seal member 62. Besides, spherical spacers 64 are sprinkled on the whole active matrix substrate 61. The spacers 64 may be sprinkled before or after formation of the first seal member 62. In either case, it is possible to secure the distance between the active matrix substrate 61 and a cover member over the active matrix substrate 61 by the filler (not shown) or the spacers 64.

Incidentally, in view of suppression of deterioration of the EL element, it is effective to make the spacer 64 have a hygroscopic property. Besides, it is desirable that the spacer 64 is made of a material transmitting light emitted from the light emitting layer.

A pixel portion and a driving circuit portion are included in a region 65 surrounded by the seal member 62. In this specification, a portion constituted by the pixel portion and the driving circuit portion is called an active matrix portion. That is, the active matrix substrate 61 is formed such that a plurality of active matrix portions each being made of a combination of the pixel portion and the driving circuit portion are formed on one large substrate.

Figure 11B:
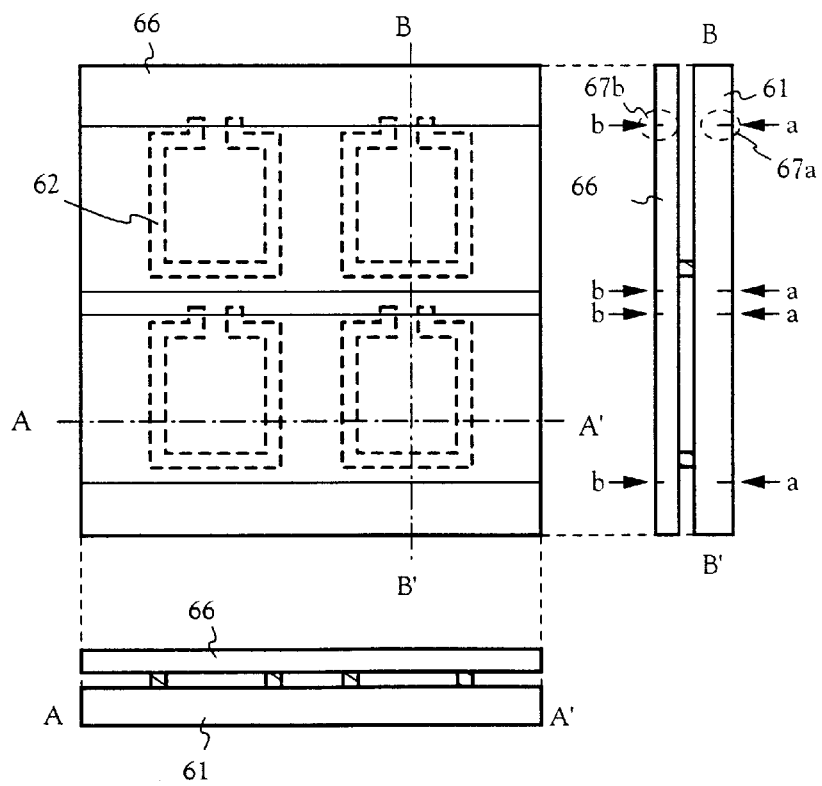

FIG. 11B shows a state where a cover member 66 is bonded to the active matrix substrate 61. In this specification, a cell including the active matrix substrate 61, the first seal member 62, and the cover member 66 is called an active matrix cell.

A process similar to a cell assembling step of liquid crystal may be used for the above bonding. Besides, as the cover member 66, a transparent substrate (or transparent film) having the same area as the active matrix substrate 61 may be used. Thus, in the state of FIG. 11B, it is used as the cover member common to all the active matrix portions.

After the cover member 66 is bonded, the active matrix cell is divided into parts. In this embodiment, when the active matrix substrate 61 and the cover member 66 are divided into parts, a scriber is used. The scriber is such a device that after a thin groove (scribe groove) is formed in the substrate, shock is given to the scribe groove to generate a crack along the scribe groove so that the substrate is divided into parts.

Incidentally, as a device for dividing a substrate into parts, a dicer is also known. The dicer is such a device that a hard cutter (also referred to as dicing saw) is rotated at high speed and is put to a substrate to divide it into parts. However, when the dicer is used, water is jetted to the dicing saw to prevent heat generation and splash of abrasive powder. Thus, in the case where the EL display device is fabricated, it is desirable to use the scriber, which does not use water.

As the sequence forming the scribe groove in the active matrix substrate 61 and the cover member 66, first, a scribe groove 67a is formed in the direction of the arrow (a), and next, a scribe groove 67b is formed in the direction of the arrow (b). At this time, the scribe groove passing through the vicinity of the opening portion 63 is formed to cut the first seal member 62. By doing so, since the opening portion 63 appears at the end face of the active matrix cell, a subsequent injection step of a filler is facilitated.

When the scribe grooves are formed in this way, a shock is given to the scribe grooves by an elastic bar of silicone resin or the like to generate cracks, so that the active matrix substrate 61 and the cover member 66 are divided into parts.

Figure 12A:
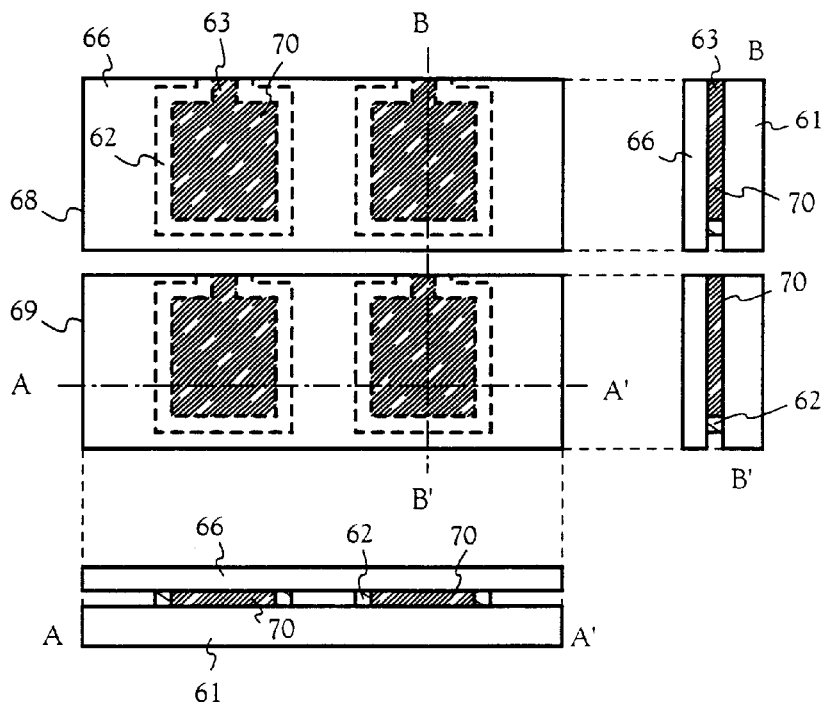
FIGS. 12A and 12B are diagrams showing the processes of obtaining multiple number of an EL display device of Embodiment 4.
Figure 12B:
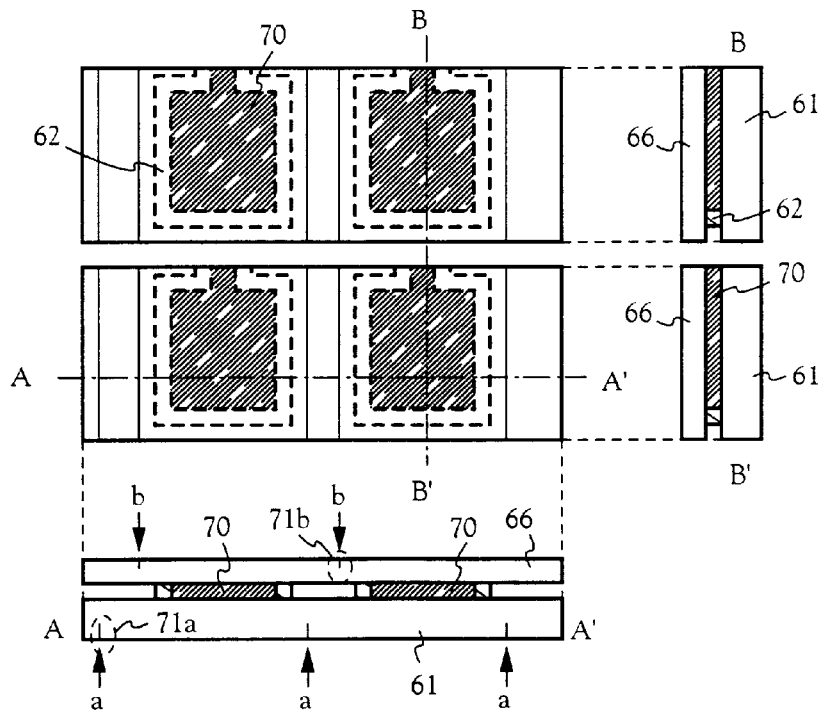

FIG. 12A shows the state after the first division, and active matrix cells 68 and 69 each including two active matrix portions are formed through the division. Next, a filler 70 is injected into a space formed of the active matrix substrate 61, the first seal member 62 and the cover member 66 by a vacuum injection method. Since the vacuum injection method is well known as a technique of injecting liquid crystal, its explanation is omitted. At this time, it is preferable that the viscosity of the filler 70 is 3 to 15 cp. The filler having such viscosity may be selected, or desired viscosity may be made by dilution with a solvent or the like. Besides, the vacuum injection method may be carried out in the state where a drying agent is added in the filler.

In this way, the filler 70 is filled as shown in FIG. 12A. Incidentally, although this embodiment shows a system in which the filler 70 is filled into the plurality of active matrix cells at the same time, the system like this is suitable for fabrication of a small EL display device with a diagonal of about 0.5 to 1 inch. On the other hand, when a large EL display device with a diagonal of about 5 to 30 inches is fabricated, it is appropriate that after division into the respective active matrix cells is made, the filler 70 is filled.

After the filler 70 is filled in the manner described above, the filler 70 is hardened so that the adhesiveness between the active matrix substrate 61 and the cover member 66 is further raised. When the filler 70 is an ultraviolet ray curing resin, ultraviolet rays are irradiated, and when it is a thermosetting resin, heating is made. However, in the case where the thermosetting resin is used, attention must be paid to the heat resistance of the organic EL material.

Next, scribe grooves are again formed in the active matrix substrate 61 and the cover member 66. As the sequence, first, a scribe groove 71a is formed in the direction of the arrow (a), and next, a scribe groove 71b is formed in the direction of the arrow (b). At this time, the scribe grooves are formed so that the area of the cover member 66 becomes smaller as compared with the active matrix substrate 61 after the division.

Figure 13A:
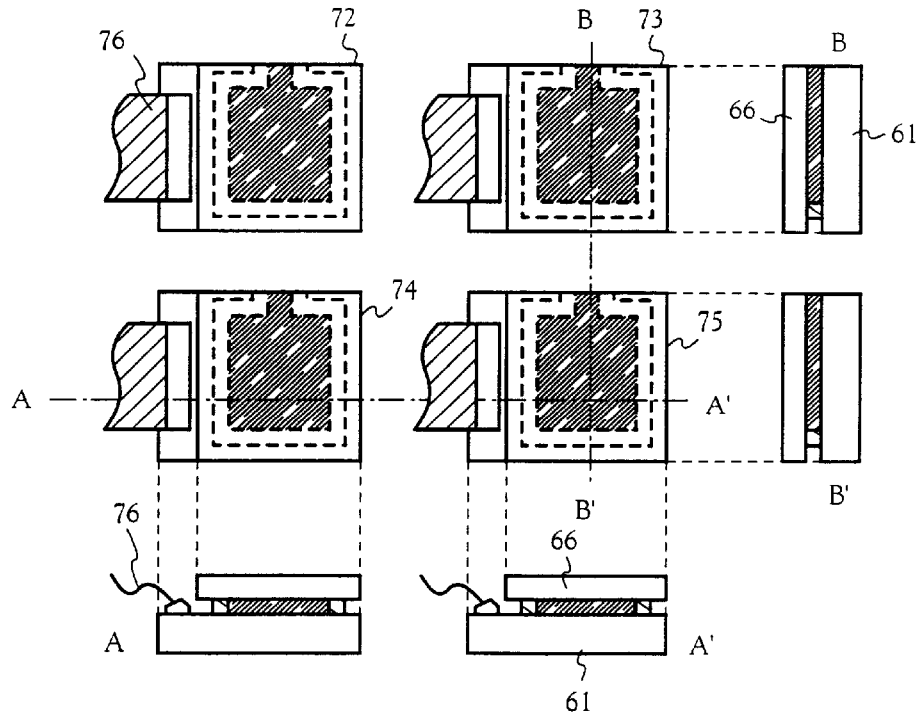
FIGS. 13A and 13B are diagrams showing the processes of obtaining multiple number of an EL display device of Embodiment 4.

After the scribe grooves are formed in this way, a shock is given to the scribe grooves by an elastic bar of silicone resin or the like to generate cracks, so that division into active matrix cells 72 to 75 is made. FIG. 13A shows the state after the second division. Further, an FPC 76 is attached to each of the active matrix cells 72 to 75.

Figure 13B:
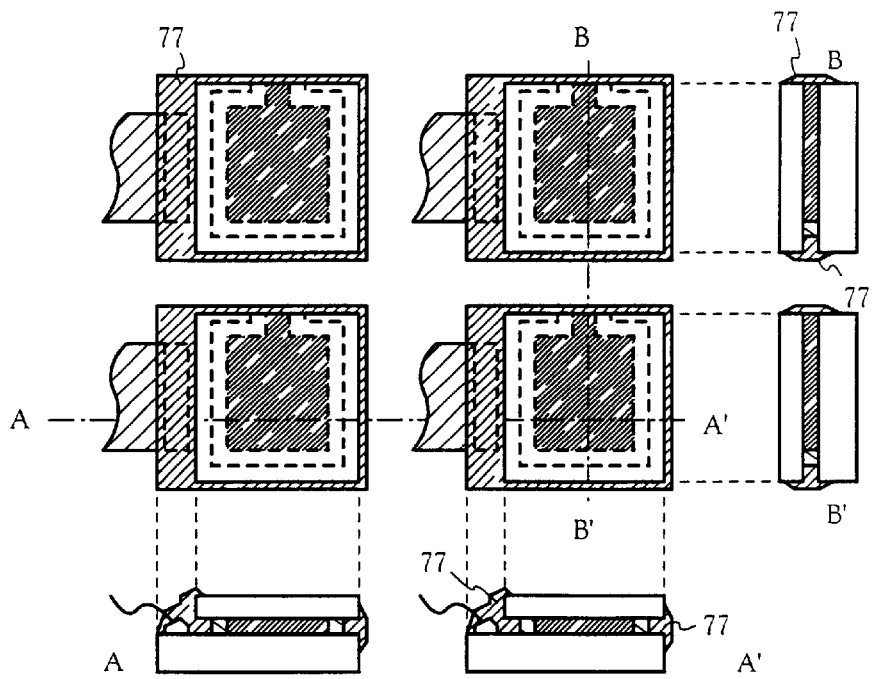

Finally, as shown in FIG. 13B, a second seal member 77 is formed so as to cover the substrate end face (exposed face of the first seal member 62 or the filler 70) of each of the active matrix cells 72 to 75 and the FPC 76. The second seal member 77 may be formed of an ultraviolet ray curing resin or the like in which degassing hardly occurs.

By the process described above, the EL display device as shown in FIG. 13B is completed. As described above, by carrying out this embodiment, a plurality of EL display devices can be fabricated from one substrate. For example, from a substrate of 620 mm×720 mm, six EL display devices each having a diagonal of 13 to 14 inches can be formed, or four EL display devices each having a diagonal of 15 to 17 inches can be formed. Thus, a throughput can be greatly improved and manufacturing costs can be reduced.

Incidentally, the fabricating process of an EL display device of this embodiment can be used for fabrication of an EL display device including any structure of the embodiments 1 to 3.

[Embodiment 5]

In this embodiment, a description will be made on an example of a case where the filler 70 is not used in the embodiment 4. This embodiment is characterized in that after an active matrix cell is placed in a vacuum, a dry inert gas pressurized to 1 to 2 atmospheres is sealed in a region surrounded by the first seal member 62. As the inert gas, nitrogen or rare gas (typically argon, helium or neon) may be used.

Incidentally, this embodiment can use the process of the embodiment 4 as it is, except that a material vacuum injected in the embodiment 4 is made a gas. Thus, the fabricating process of the EL display device of this embodiment can be used for fabrication of the EL display device including any structure of the embodiments 1 to 3.

[Embodiment 6]

In the embodiments 1 to 5, although the description has been made on the EL display device, the present invention can also be used for an active matrix electrochromic display (ECD), field emission display (FED), or liquid crystal display (LCD).

That is, the present invention can be used for any electronic devices in which a self light-emitting device or a light receiving element is electrically connected to an TFT.

[Embodiment 7]

In Embodiment 1 laser crystallization is used for formation method of crystal silicon film 302, in this embodiment in the case of using another crystallization method is described.

After forming an amorphous silicon film in this embodiment, crystallization can be performed using the technique recorded in Japanese Patent Application Laid-open No. Hei 7-130652 or Japanese Patent Application Laid-open No. Hei 8-78329. The technique recorded in the above patent applications is one of obtaining a crystalline silicon film having good crystallinity by using an element such as nickel as a catalyst for promoting crystallization.

Further, after th crystallization process is completed process of removing the catalyst used in the crystallization may be performed. In this case, the catalyst may be gettered using the technique recorded in Japanese Patent Application Laid-open No. Hei 10-270363 or Japanese Patent Application Laid-open No. Hei 8-330602.

In addition, a TFT may be formed using the technique recorded in the specification of Japanese Patent Application Serial No. Hei 11-076967 by the applicant of the present invention.

Note that it is possible to freely combine the constitution of the present embodiment with the constitution of any of embodiments 1 to 6 in a case that an electronic device is produced.

[Embodiment 8]

Figure 16A:
FIGS. 16A and 16B are photographs showing images of the EL display device of Embodiment 8.
Figure 16B:

In this embodiment, FIGS. 16A and 16B indicate image photographs of an EL display device which is fabricated by the present invention. FIG. 16A is an image photograph of an EL display device when a monomer type organic EL material is used as the light-emitting layer. Further, FIG. 16B is an image photograph of an EL display device produced when a polymer type organic EL material is used as the light-emitting layer.

[Embodiment 9]

The EL display device fabricated in accordance with the present invention is of the self-emission type, and thus exhibits more excellent recognizability of the displayed image in a light place as compared to the liquid crystal display device. Furthermore, the EL display device has a wider viewing angle. Accordingly, the EL display device can be applied to a display portion in various electric apparatuses. For example, in order to view a TV program or the like on a large-sized screen, the EL display device in accordance with the present invention can be used as a display portion of an EL display (i.e., a display in which an EL display device is installed into a frame) having a diagonal size of 30 inches or larger (typically 40 inches or larger.)

The EL display includes all kinds of displays to be used for displaying information, such as a display for a personal computer, a display for receiving a TV broadcasting program, a display for advertisement display. Moreover, the EL display device in accordance with the present invention can be used as a display portion of other various electric apparatuses.

Such electric apparatuses include a video camera, a digital camera, a goggles-type display (head mount display), a car navigation system, a sound reproduction device (an audio equipment), note-size personal computer, a game machine, a portable information terminal (a mobile computer, a portable telephone, a portable game machine, an electronic book, or the like), an image reproduction apparatus including a recording medium (more specifically, an apparatus which can reproduce a recording medium such as a digital video disc (DVD), and includes a display for displaying the reproduced image), or the like. In particular, in the case of the portable information terminal, use of the EL display device is preferable, since the portable information terminal that is likely to be viewed from a tilted direction is often required to have a wide viewing angle. FIGS. 14A through 15B respectively show various specific examples of such electronic devices.

Figure 14A:
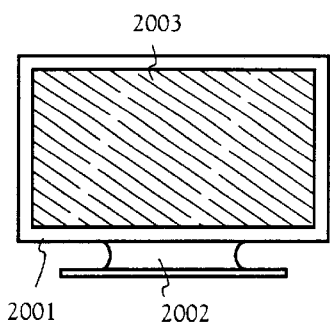
FIGS. 14A to 14F are diagrams showing specific exams of electric apparatus of Embodiment 9.

FIG. 14A illustrates an EL display which includes a frame 2001, a support table 2002, a display portion 2003, or the like. The present invention is applicable to the display portion 2003. The EL display is of the self-emission type and therefore requires no back light. Thus, the display portion thereof can have a thickness thinner than that of the liquid crystal display device.

Figure 14B:
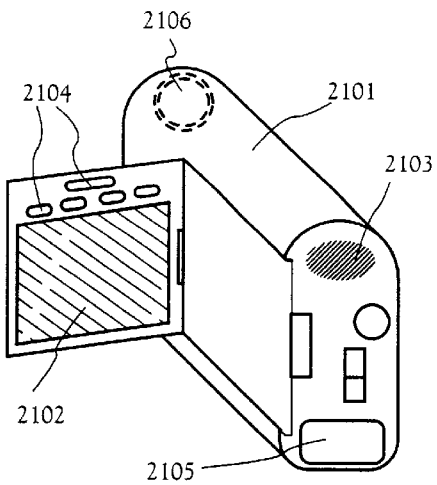

FIG. 14B illustrates a video camera which includes a main body 2101, a display portion 2102, an audio input portion 2103, operation switches 2104, a battery 2105, an image receiving portion 2106, or the like. The EL display device in accordance with the present invention can be used as the display portion 2102.

Figure 14C:
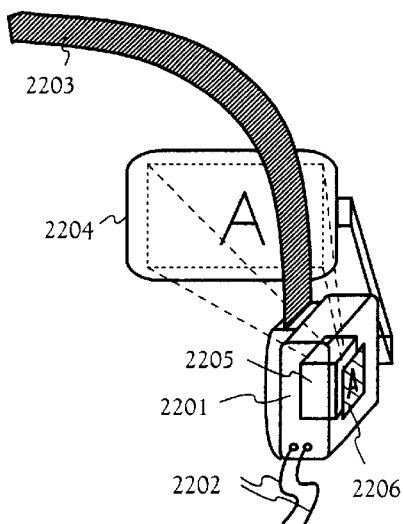

FIG. 14C illustrates a portion (the right-half piece) of an EL display of head mount type, which includes a main body 2201, signal cables 2202, a head mount band 2203, a display portion 2204, an optical system 2205, an EL display device 2206, or the like. The present invention is applicable to the EL display device 2206.

Figure 14D:
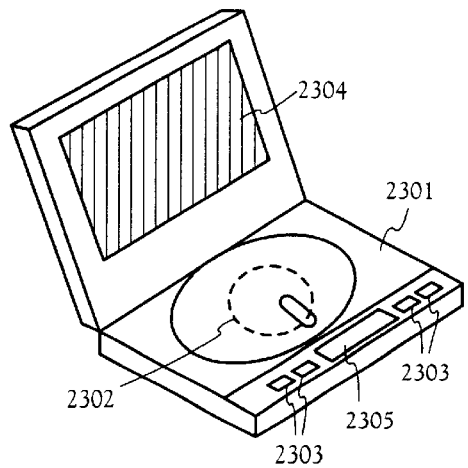

FIG. 14D illustrates an image reproduction apparatus including a recording medium (more specifically, a DVD reproduction apparatus), which includes a main body 2301, a recording medium (a DVD or the like) 2302, operation switches 2303, a display portion (a) 2304, another display portion (b) 2305, or the like. The display portion (a) is used mainly for displaying image information, while the display portion (b) is used mainly for displaying character information. The EL display device in accordance with the present invention can be used as these display portions (a) and (b). The image reproduction apparatus including a recording medium further includes a CD reproduction apparatus, a game machine or the like.

Figure 14E:
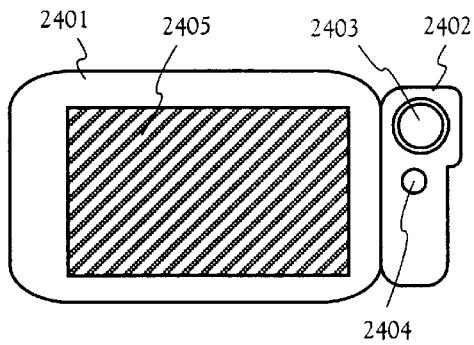

FIG. 14E illustrates a portable (mobile) computer which includes a main body 2401, a camera portion 2402, an image receiving portion 2403, operation switches 2404, a display portion 2405, or the like. The EL display device in accordance with the present invention can be used as the display portion 2405.

Figure 14F:
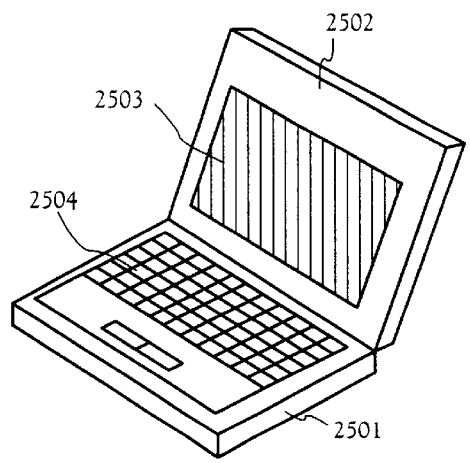

FIG. 14F illustrates a personal computer which includes a main body 2501, a frame 2502, a display portion 2503, a key board 2504, or the like. The EL display device in accordance with the present invention can be used as the display portion 2503.

When the brighter luminance of light emitted from the EL material becomes available in the future, the EL display device in accordance with the present invention will be applicable to a front-type or rear-type projector in which light including output image information is enlarged by means of lenses or the like to be projected.

The aforementioned electronic devices are more likely to be used for display information distributed through a telecommunication path such as Internet, a CATV (cable television system), and in particular likely to display moving picture information. The EL display device is suitable for displaying moving pictures since the EL material can exhibit high response speed. However, if the contour between the pixels becomes unclear, the moving pictures as a whole cannot be clearly displayed. Since the EL display device in accordance with the present invention can make the contour between the pixels clear, it is significantly advantageous to apply the EL display device of the present invention to a display portion of the electronic devices.

A portion of the EL display device that is emitting light consumes power, so it is desirable to display information in such a manner that the light emitting portion therein becomes as small as possible. Accordingly, when the EL display device is applied to a display portion which mainly displays character information, e.g., a display portion of a portable information terminal, and more particular, a portable telephone or a sound reproduction equipment, it is desirable to drive the EL display device so that the character information is formed by a light-emitting portion while a non-emission portion corresponds to the background.

Figure 15A:
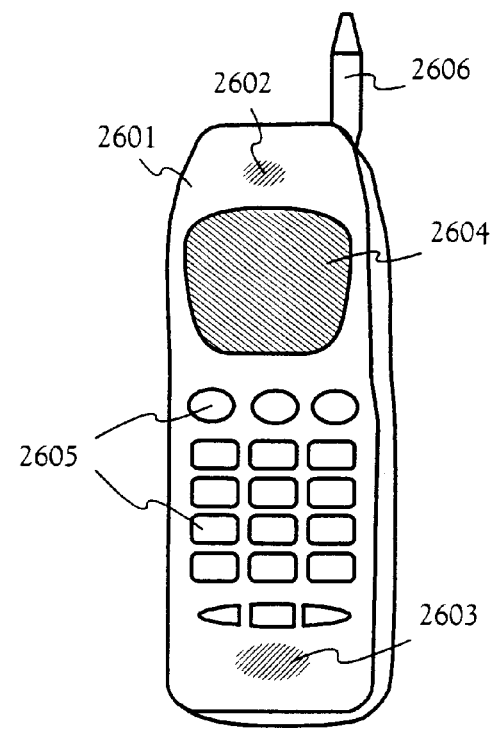
FIGS. 15A and 15B are diagrams showing specific examples of electric apparatus of Embodiment 9.

With now reference to FIG. 15A, a cellular telephone is illustrated, which includes a main body 2601, an audio output portion 2602, an audio input portion 2603, a display portion 2604, operation switches 2605, and an antenna 2606. The EL display device in accordance with the present invention can be used as the display portion 2604. The display portion 2604 can reduce power consumption of the portable telephone by displaying white-colored characters on a black-colored background.

Figure 15B:
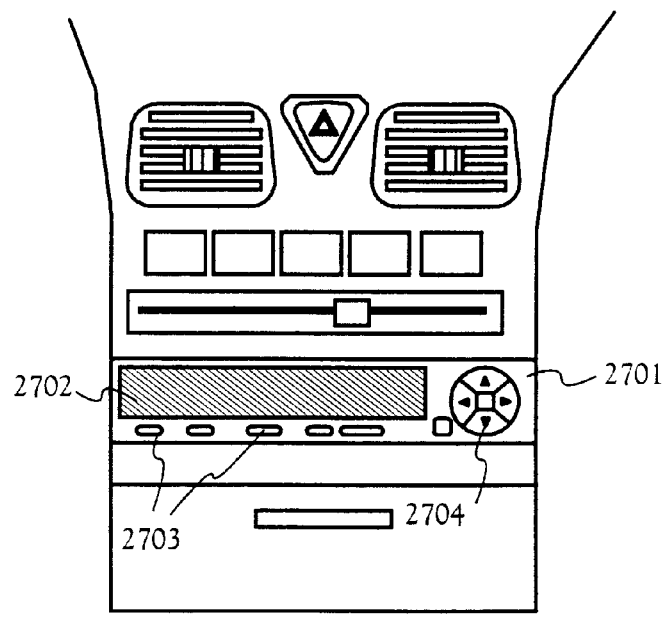

FIG. 15B illustrates a sound reproduction device, a car audio equipment in concrete term, which includes a main body 2701, a display portion 2702, and operation switches 2703 and 2704. The EL display device in accordance with the present invention can be used as the display portion 2702. Although the car audio equipment of the mount type is shown in the present embodiment, the present invention is also applicable to an audio of the set type. The display portion 2702 can reduce power consumption by displaying white-colored characters on a black-colored background, which is particularly advantageous for the audio of the portable type.

As set forth above, the present invention can be applied variously to a wide range of electric apparatuses in all fields. The electronic device in the present embodiment can be obtained by utilizing an EL display device having the configuration in which the structures in Embodiments 1 through 8 are freely combined According to the invention, it can be possible to omit the capacitor which is conventionally used to hold the gate voltage of the current control TFT, so that the effective light emission area per one pixel is greatly increased. Thus, an electronic device of bright image display can be obtained. Furthermore, an electric apparatus with high performance is provided by using the electronic device as its display portion.

What is claimed is:

1. An electronic device comprising:
   a first thin film transistor;
   a second thin film transistor having:
   a gate electrode,
   a gate insulating film,
   at least an LDD region,
   wherein the gate electrode of the second thin film transistor is electrically connected to a drain wiring of the first thin film transistor;
   a self light emitting element,
   wherein the self light emitting element is electrically connected to a drain wiring of the second thin film transistor,
   wherein the second thin film transistor is a p-channel thin film transistor,
   wherein at least a portion of the LDD region of the second thin film transistor is overlapped with the gate electrode with the gate insulating film interposed therebetween.

2. A device according to claim 1,
   wherein the LDD region of the second thin film transistor includes a p-type impurity element at a concentration in a range of $1 \times 10^{15}$ to $5 \times 10^{17}$ atoms/cm$^3$.

3. An electric apparatus using the electronic device of claim 1.

4. An electronic device comprising:
   a first thin film transistor;
   a second thin film transistor having:
   a gate electrode,
   a gate insulating film,
   at least an LDD region,
   wherein the gate electrode of the second thin film transistor is electrically connected to a drain wiring of the first thin film transistor;
   a self light emitting element,
   wherein the self light emitting element is electrically connected to a drain wiring of the second thin film transistor,
   wherein the second thin film transistor is a p-channel thin film transistor,
   wherein at least a portion of the LDD region of the second thin film transistor is overlapped with the gate electrode with the gate insulating film interposed therebetween,
   wherein the first thin film transistor includes a plurality of thin film transistors being connected in series.

5. A device according to claim 4,
   wherein the LDD region of the second thin film transistor includes a p-type impurity element at a concentration in a range of $1 \times 10^{15}$ to $5 \times 10^{17}$ atoms/cm$^3$.

6. An electric apparatus using the electronic device of claim 4.

7. An electronic device comprising a pixel portion and a driver circuit portion, said electronic device comprising:
an n-channel thin film transistor being formed in the driver circuit portion, said n-channel thin film transistor having:
a first gate electrode,
a first gate insulating film,
at least a first LDD region,
wherein the first LDD region is overlapped with the first gate electrode with the first gate insulating film interposed therebetween,
a first thin film transistor being formed in the pixel portion;
a second thin film transistor being formed in the pixel portion, said second thin film transistor having:
a second gate electrode,
a second gate insulating film,
at least a second LDD region,
a self light emitting element being formed in the pixel portion,
wherein the self light emitting element is electrically connected to the second thin film transistor,
wherein the second thin film transistor is a p-channel thin film transistor,
wherein at least a portion of the second LDD region of the second thin film transistor is overlapped with the second gate electrode with the second gate insulating film interposed therebetween.

8. A device according to claim 7,
wherein the second LDD region of the second thin film transistor includes a p-type impurity element at a concentration in a range of $1 \times 10^{15}$ to $5 \times 10^{17}$ atoms/cm$^3$.

9. An electric apparatus using the electronic device of claim 7.

10. An electronic device comprising a pixel portion and a driver circuit portion, said electronic device comprising:
an n-channel thin film transistor being formed in the driver circuit portion, said n-channel thin film transistor having:
a first gate electrode,
a first gate insulating film,
at least a first LDD region,
wherein the first LDD region is overlapped with the first gate electrode with the first gate insulating film interposed therebetween,
a first thin film transistor being formed in the pixel portion;
a second thin film transistor being formed in the pixel portion, said second thin film transistor having:
a second gate electrode,
a second gate insulating film,
at least a second LDD region,
a self light emitting element being formed in the pixel portion,
wherein the self light emitting element is electrically connected to the second thin film transistor,
wherein the second thin film transistor is a p-channel thin film transistor,
wherein at least a portion of the second LDD region of the second thin film transistor is overlapped with the second gate electrode with the second gate insulating film interposed therebetween,
wherein the thin film transistor includes a plurality of thin film transistors being connected in series.

11. A device according to claim 10,
wherein the second LDD region of the second thin film transistor includes a p-type impurity element at a concentration in a range of $1 \times 10^{15}$ to $5 \times 10^{17}$ atoms/cm$^3$.

12. An electric apparatus using the electronic device of claim 10.

* * * * *